(12) United States Patent
Sato

(10) Patent No.: US 10,705,582 B2
(45) Date of Patent: Jul. 7, 2020

(54) COOLING APPARATUS, CONTROL METHOD, AND STORAGE MEDIUM

(71) Applicant: NEC CORPORATION, Tokyo (JP)

(72) Inventor: Masanori Sato, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 110 days.

(21) Appl. No.: 16/087,261

(22) PCT Filed: Mar. 23, 2017

(86) PCT No.: PCT/JP2017/011790
§ 371 (c)(1),
(2) Date: Feb. 13, 2019

(87) PCT Pub. No.: WO2017/164326
PCT Pub. Date: Sep. 28, 2017

(65) Prior Publication Data
US 2019/0179384 A1    Jun. 13, 2019

(30) Foreign Application Priority Data

Mar. 24, 2016  (JP) .................................. 2016-060682

(51) Int. Cl.
*G06F 1/20* (2006.01)
*F25B 1/00* (2006.01)
(Continued)

(52) U.S. Cl.
CPC .............. *G06F 1/206* (2013.01); *F24F 11/89* (2018.01); *F25B 1/00* (2013.01); *G06F 1/20* (2013.01);
(Continued)

(58) Field of Classification Search
None
See application file for complete search history.

(56) References Cited

U.S. PATENT DOCUMENTS

| | | | |
|---|---|---|---|
| 2001/0019120 A1* | 9/2001 | Schnur | C10M 171/008 252/68 |
| 2003/0131617 A1* | 7/2003 | Schmid | F25D 11/02 62/180 |

(Continued)

FOREIGN PATENT DOCUMENTS

| | | |
|---|---|---|
| JP | 2008-002743 A | 1/2008 |
| JP | 2012-193903 A | 10/2012 |

(Continued)

OTHER PUBLICATIONS

Written Opinion for PCT/JP2017/011790, dated May 30, 2017.
International Search Report for PCT/JP2017/011790, dated May 30, 2017.

*Primary Examiner* — Ryan A Jarrett
(74) *Attorney, Agent, or Firm* — Sughrue Mion, PLLC

(57) ABSTRACT

A freezer power calculation unit calculates power consumption Wc of a freezer, based on a heat exchanging amount Q of an electronic device and a performance coefficient COP_c of the freezer. An apparatus performance coefficient calculation unit calculates an apparatus performance coefficient ACOP, based on a calorific value Q of the electronic device, Wc, and power consumption Wf of an air conditioning blower unit. Note that the apparatus performance coefficient ACOP is a performance coefficient of an apparatus including an evaporator, a condenser, a heat exchanger, the freezer, and the air conditioning blower unit. A blower rotational speed control unit controls a rotational speed r of the air conditioning blower unit, based on the apparatus performance coefficient ACOP. A coolant temperature control unit controls a first coolant temperature Tin being a temperature of coolant COO flowing from the freezer, based on the apparatus performance coefficient ACOP.

7 Claims, 13 Drawing Sheets

(51) Int. Cl.
*H05K 7/20* (2006.01)
*F24F 11/89* (2018.01)
*F24F 11/46* (2018.01)
*F25B 49/00* (2006.01)

(52) U.S. Cl.
CPC ..... *H05K 7/20381* (2013.01); *H05K 7/20827* (2013.01); *H05K 7/20836* (2013.01); *F24F 11/46* (2018.01); *F25B 49/00* (2013.01); *Y02B 30/746* (2013.01); *Y02D 10/16* (2018.01)

(56) References Cited

U.S. PATENT DOCUMENTS

| | | | |
|---|---|---|---|
| 2012/0047911 A1* | 3/2012 | Bhavsar | F25B 21/02 62/3.6 |
| 2014/0183957 A1 | 7/2014 | Duchesneau | |
| 2017/0089598 A1* | 3/2017 | Wallace | G05B 23/0262 |

FOREIGN PATENT DOCUMENTS

| | | |
|---|---|---|
| JP | 2014-157494 A | 8/2014 |
| WO | 2014/192252 A1 | 12/2014 |

\* cited by examiner

COOLING APPARATUS, CONTROL METHOD, AND STORAGE MEDIUM

CROSS REFERENCE TO RELATED APPLICATIONS

This Application is a National Stage of International Application No. PCT/JP2017/011790 filed Mar. 23, 2017, claiming priority based on Japanese Patent Application No. 2016-060682 filed Mar. 24, 2016, the disclosure of which is incorporated herein in its entirety by reference.

TECHNICAL FIELD

The present invention relates to a cooling apparatus and the like, and, for example, relates to a cooling apparatus and the like for cooling an electronic device.

BACKGROUND ART

In recent years, an amount of information processing is increasing, accompanied by development of a cloud service. In order to process this enormous amount of information, a data center is provided and operated in a plurality of regions. In a data center, electronic devices such as a server and a network device are collectively installed. Thus, energy efficiency of a data center is enhanced.

In an electronic device such as a server and a network device within a data center provided in each region, for example, heat generating components such as a central processing unit (CPU) and a large scale integration (LSI) are accommodated. These heat generating components accompany heat generation. Therefore, in a data center, electronic devices are cooled by using an air conditioner, for example.

However, since an amount of information processing of a data center is increasing, power consumption of an air conditioner is also increasing. Therefore, a running cost of a data center is also increasing. In view of the above, reducing power consumption of an air conditioner in a data center is being demanded.

PTL 1 discloses a technique for reducing power consumption of an air conditioner, as an ambient heat exchange system. In PTL 1, an ambient heat exchange system includes an air cooling heat exchanger 11, a heat exchanger 12, a pump 13, and a control device 30. The air cooling heat exchanger 11 is a heat exchanger installed outdoors. The heat exchanger 12 is a heat exchanger installed indoors. The air cooling heat exchanger 11 includes a heat exchanger body 11*a*, a fan 11*b* (air conditioner), and the like. A thermometer 21 measures an intake air temperature of the air cooling heat exchanger 11. A thermometer 22 measures an exhaust air temperature of the air cooling heat exchanger 11. A wattmeter 23 measures power consumed by the pump 13. A wattmeter 24 of the fan 11*b* measures power consumption of the fan 11*b*. The control device 30 controls a rotational speed of the fan 11*b*.

Further, the control device 30 calculates a heat exchanging amount of the air cooling heat exchanger 11, based on a temperature difference between an intake air temperature and an exhaust air temperature of the air cooling heat exchanger 11, and an amount of airflow from a fan being calculated from a rotational speed of the fan 11*b*. The control device 30 calculates a coefficient of performance (COP), based on a calculated value of a heat exchanging amount, and power consumption of the pump 13 and the fan 11*b*. A coefficient of performance is an index indicating cooling ability per unit power consumption. Further, the control device 30 increases or decreases a rotational speed of the fan 11*b* in such a way as to increase a calculated coefficient of performance.

In this way, in the technique described in PTL 1, an ambient heat exchange system calculates a coefficient of performance (COP), based on a heat exchanging amount with respect to ambient air and power consumption in the ambient heat exchange system, and controls a rotational speed of a fan in the ambient heat exchange system, based on the coefficient of performance (COP). Further, when a coefficient of performance (COP) falls below a predetermined threshold value, the ambient heat exchange system is stopped. Thus, energy saving is performed by performing an operation with maximum efficiency in various ambient conditions.

CITATION LIST

Patent Literature

[PTL 1] Japanese Unexamined Patent Application Publication No. 2012-193903

SUMMARY OF INVENTION

Technical Problem

However, in the technique described in PTL 1, the control device 30 calculates a COP by using a temperature difference between an intake air temperature and an exhaust air temperature of the fan 11*b* of the air cooling heat exchanger 11.

Herein, a temperature difference between an intake air temperature and an exhaust air temperature of the air cooling heat exchanger 11 may greatly vary depending on an installation place of the thermometer 21 and the thermometer 22 of the air cooling heat exchanger 11. Since fluctuation of wind power is particularly large on an exhaust side of the fan 11*b*, when the thermometer 22 for measuring an exhaust air temperature of the air cooling heat exchanger 11 is installed in the vicinity of the fan 11*b*, as in the technique described in PTL 1, a temperature difference between an intake air temperature and an exhaust air temperature of the air cooling heat exchanger 11 may greatly vary. Consequently, there is a problem that the control device 30 may not perform a stable operation, since a COP to be calculated by the control device 30 greatly varies depending on wind power of the fan 11*b*.

The present invention has been made in view of the above circumstances, and an object of the present invention is to provide a cooling apparatus and the like capable of being operated more stably and with enhanced energy efficiency.

Solution to Problem

A cooling apparatus according to the present invention includes: an evaporator for receiving exhaust heat of an electronic device; a condenser for releasing the exhaust heat received by the evaporator; a heat exchanger for receiving exhaust heat of the electronic device; a freezer for releasing exhaust heat received by the heat exchanger and the evaporator by circulating coolant between the condenser and the heat exchanger; a blower unit for supplying a blast for cooling the electronic device to the electronic device; and a control means for controlling operations of the blower unit and the freezer. The control means includes: a blower power calculation means for calculating power consumption of a blower unit, based on a rotational speed of the blower unit; a freezer power calculation means for acquiring power consumption of the freezer, based on a calorific value of the electronic device and a performance coefficient of the freezer; an apparatus performance coefficient calculation means for acquiring an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit; a blower unit rotation control means for controlling a rotational speed of the blower unit, based on the apparatus performance coefficient; and a coolant temperature control means for controlling a first coolant temperature being a temperature of the coolant flowing from the freezer, based on the apparatus performance coefficient.

A control method according to the present invention is a control method of a cooling apparatus including: an evaporator for receiving exhaust heat of an electronic device; a condenser for releasing the exhaust heat received by the evaporator; a heat exchanger for receiving exhaust heat of the electronic device; a freezer for releasing exhaust heat received by the heat exchanger and the evaporator by circulating coolant between the condenser and the heat exchanger; a blower unit for supplying a blast for cooling the electronic device to the electronic device; and a control means for controlling operations of the blower unit and the freezer. The control method includes: calculating power consumption of a blower unit, based on a rotational speed of the blower unit; acquiring power consumption of the freezer, based on a calorific value of the electronic device and a performance coefficient of the freezer; acquiring an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit; controlling a rotational speed of the blower unit, based on the apparatus performance coefficient; and controlling a first coolant temperature being a temperature of the coolant flowing from the freezer, based on the apparatus performance coefficient.

A storage medium according to the present invention is a storage medium storing a control program of a cooling apparatus including: an evaporator for receiving exhaust heat of an electronic device; a condenser for releasing the exhaust heat received by the evaporator; a heat exchanger for receiving exhaust heat of the electronic device; a freezer for releasing exhaust heat received by the heat exchanger and the evaporator by circulating coolant between the condenser and the heat exchanger; a blower unit for supplying a blast for cooling the electronic device to the electronic device; and a control means for controlling operations of the blower unit and the freezer. The storage medium stores a control program that causes a computer to execute processing of: calculating power consumption of a blower unit, based on a rotational speed of the blower unit; acquiring power consumption of the freezer, based on a calorific value of the electronic device and a performance coefficient of the freezer; acquiring an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit; controlling a rotational speed of the blower unit, based on the apparatus performance coefficient; and controlling a first coolant temperature being a temperature of the coolant flowing from the freezer, based on the apparatus performance coefficient.

Advantageous Effects of Invention

In a cooling apparatus and the like according to the present invention, it is possible to operate the cooling apparatus more stably and with enhanced energy efficiency.

EXAMPLE EMBODIMENT

First Example Embodiment

Figure 1:
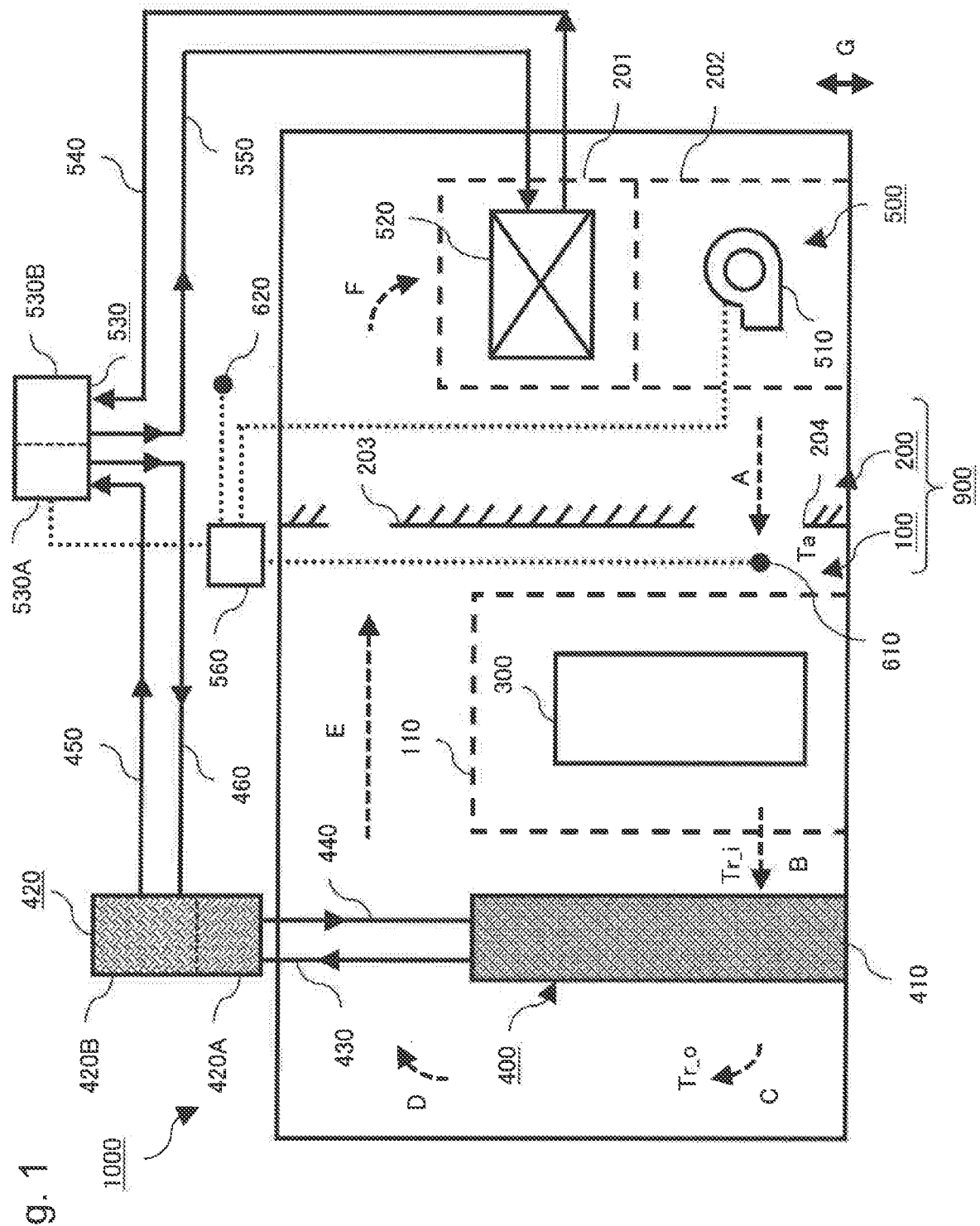
FIG. 1 is a transparent view illustrating a configuration of a cooling apparatus in a first example embodiment of the present invention.

A configuration of a cooling apparatus 1000 in a first example embodiment of the present invention is described. FIG. 1 is a transparent view illustrating a configuration of the cooling apparatus 1000. Note that FIG. 1 illustrates a vertical direction G. The cooling apparatus 1000 is installed in a data center, for example.

As illustrated in FIG. 1, the cooling apparatus 1000 includes a local cooler 400 and an air conditioner 500. An evaporator 410 of the local cooler 400, and an electronic device 300 are provided within a server room 100. An air conditioning blower unit 510 and a heat exchanger 520 of the air conditioner 500 are provided within a machine room 200. Note that an inside of a housing 900 constituted by connecting the server room 100 and the machine room 200 is sealed.

As illustrated in FIG. 1, the server room 100 is formed into a rectangular parallelepiped shape, for example. An inside of the server room 100 is made hollow. Preferably, as a material for the server room 100, a member having thermal insulation (e.g. a concrete wall and the like) is used. The server room 100 includes a rack 110. The server room 100 accommodates the rack 110, and a part of components of the local cooler 400.

As illustrated in FIG. 1, the rack 110 is formed into a rectangular parallelepiped shape, for example. An inside of the rack 110 is made hollow. Further, the rack 110 is formed into a mesh shape. Therefore, air is allowed to flow in and out of the rack 110 through meshes. The rack 110 accommodates the electronic device 300. Preferably, as a material for the rack 110, a member having high thermal conductivity (e.g. aluminum, aluminum alloy, and the like) is used. The rack 110 is also referred to as an electronic device accommodation unit. Note that the rack 110 may be omitted, and the electronic device 300 may be accommodated within the server room 100.

As illustrated in FIG. 1, the machine room 200 is formed into a rectangular parallelepiped shape, for example. The machine room 200 is disposed adjacent to the server room 100. An inside of the machine room 200 is made hollow. Preferably, as a material for the machine room 200, a member having thermal insulation (e.g. a concrete wall and the like) is used.

As illustrated in FIG. 1, the machine room 200 accommodates a part of components of the air conditioner 500. The machine room 200 includes a first accommodation unit 201 and a second accommodation unit 202. The first accommodation unit 201 accommodates the heat exchanger 520 of the air conditioner 500. The second accommodation unit 202 accommodates the air conditioning blower unit 510 of the air conditioner 500. An inside of each of the first accommodation unit 201 and the second accommodation unit 202 is made hollow. Further, each of the first accommodation unit 201 and the second accommodation unit 202 is formed into a mesh shape. Therefore, air is allowed to flow in and out of the first accommodation unit 201 and the second accommodation unit 202 through meshes. Preferably, as a material for the first accommodation unit 201 and the second accommodation unit 202, a member having high thermal conductivity (e.g. stainless steel and the like) is used.

As illustrated in FIG. 1, the machine room 200 of the housing 900 includes a first opening portion 203 and a second opening portion 204. The first opening portion 203 and the second opening portion 204 communicate between the server room 100 and the machine room 200. Specifically, air is allowed to flow in and out between the server room 100 and the machine room 200 via the first opening portion 203 and the second opening portion 204.

As illustrated in FIG. 1, the electronic device 300 is accommodated within the rack 110. The electronic device 300 is, for example, a server (computer), a router, an uninterruptible power supply (UPS), and the like.

The electronic device 300 includes a heat generating component. The heat generating component is a component that generates heat by being operated. The heat generating component is, for example, a CPU, an LSI, or the like. When the electronic device 300 performs various data processing, the heat generating component generates heat by a load of data processing.

The cooling apparatus 1000 has three circulation paths. The first circulation path (this circulation path is referred to as a first closed loop) circulates coolant (hereinafter, referred to as COO) between the evaporator 410 and a condenser 420 via a steam pipe 430 and a liquid pipe 440. The second circulation path (this circulation path is referred to as a second closed loop) circulates coolant COO between the condenser 420 and a freezer 530 via a first pipe 450 and a second pipe 460. The third circulation path (this circulation path is referred to as a third closed loop) circulates coolant COO between the freezer 530 and the heat exchanger 520 via a third pipe 540 and a fourth pipe 550. Each of the first to third closed loops is independent as a closed space. Therefore, coolant COO to be used in each of the first to third closed loops may be made of materials different from each other. Coolant is made of a polymeric material, for example, and has a property of vaporizing at high temperature and liquefying at low temperature. Note that, in the second and third closed loops, generally, the same coolant (e.g., water) is used as coolant COO. Further, although it is described that each of the first to third closed loops is independent as a closed space, the first and second closed loops may be constituted as one closed loop.

Regarding coolant, as coolant of a low boiling point, for example, hydro fluorocarbon (HFC), hydro fluoroether (HFE), and the like may be used. Further, coolant may be water. When water is used as coolant, the water may be circulated within the local cooler 400 and the like by using circulation power such as a pump.

A method for filling coolant COO within a closed space constituting the first to third closed loops is as follows. First of all, air is expelled from a closed space constituting the first to third closed loops by using a vacuum pump (not illustrated) and the like. Next, coolant COO is injected into the closed space constituting the first to third closed loops. Thus, a pressure within the closed space constituting the first to third closed loops becomes equal to a saturated vapor pressure of coolant, and the boiling point of coolant COO sealed within the closed space constituting the first to third closed loops approaches a room temperature. As described above, a method for filling coolant COO within a closed space constituting the first to third closed loops is described.

Next, the local cooler 400 is described. The local cooler 400 includes the evaporator 410, the condenser 420, the steam pipe 430, and the liquid pipe 440.

As illustrated in FIG. 1, the evaporator 410 and the condenser 420 are connected by the steam pipe 430 and the liquid pipe 440. Further, as illustrated in FIG. 1, the first pipe 450 and the second pipe 460 are connected to the condenser 420. Note that the local cooler 400 corresponds to a cooler in the present example embodiment. A cooler in the present example embodiment, however, may be constituted by including at least the evaporator 410 and the condenser 420.

The local cooler 400 contains coolant COO that circulates between the evaporator 410 and the condenser 420. An inside of each of the evaporator 410 and the condenser 420 is made hollow. Likewise, an inside of the freezer 530 is also made hollow. Further, coolant COO is confined in a sealed state within a first closed space formed by the steam pipe 430 and the liquid pipe 440.

As illustrated in FIG. 1, the evaporator 410 is accommodated within the server room 100. As illustrated in FIG. 1, the evaporator 410 is connected to the condenser 420 by the steam pipe 430 and the liquid pipe 440. As illustrated in FIG. 1, the evaporator 410 is disposed in such a way as to face the electronic device 300. The evaporator 410 is provided vertically below the condenser 420 in the vertical direction G. As will be described later using FIG. 2, the evaporator 410 is formed in such a way that air is allowed to pass. The evaporator 410 receives heat of the electronic device 300 (e.g. exhaust heat discharged from the electronic device 300). More specifically, the evaporator 410 receives heat of the electronic device 300 via air from the air conditioning blower unit 510 of the air conditioner 500. Further, the evaporator 410 transmits heat received from the electronic device 300 to the condenser 420 via the steam pipe 430 by using coolant COO. More specifically, when the evaporator 410 receives heat of the electronic device 300, coolant COO within the evaporator 410 changes from a liquid phase state to a vapor phase state by absorbing the heat of the electronic device 300. The evaporator 410 transmits the heat received from the electronic device 300 to the condenser 420 via the steam pipe 430 by using the coolant COO in a vapor phase state. Thus, heat of the electronic device 300 is transmitted to the condenser 420.

Figure 2:
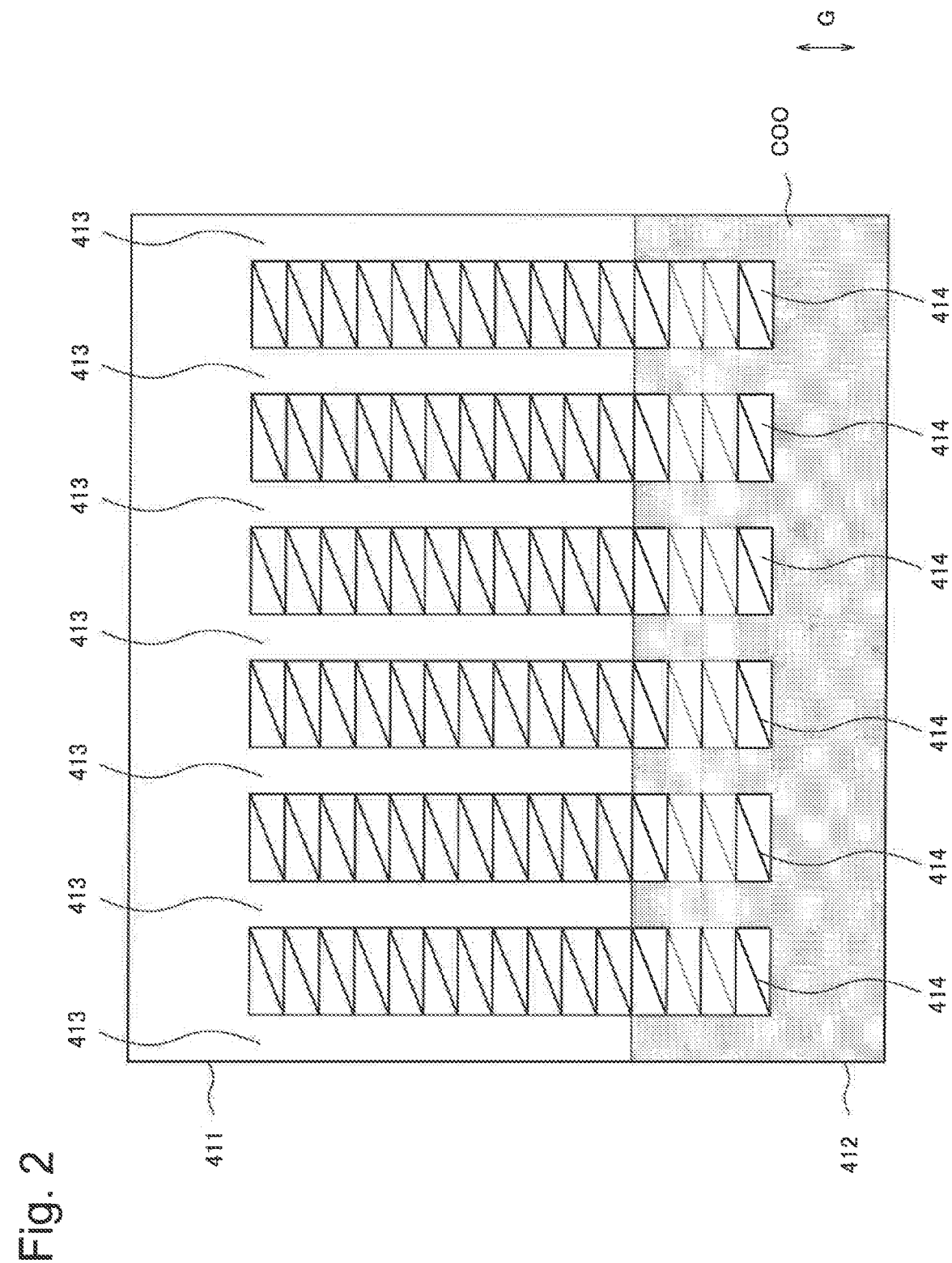
FIG. 2 is a schematic transparent view schematically illustrating an inner configuration of an evaporator.

Next, an inner configuration of the evaporator 410 is specifically described, based on the drawings. FIG. 2 is a schematic transparent view schematically illustrating an inner configuration of the evaporator 410. FIG. 2 illustrates a vertical direction G.

As illustrated in FIG. 2, the evaporator 410 is formed into a flat plate shape, for example. As illustrated in FIG. 2, an inside of the evaporator 410 is made hollow, and stores coolant COO therein.

As illustrated in FIG. 2, the evaporator 410 is constituted by including an upper tank portion 411, a lower tank portion 412, a plurality of connecting pipe portions 413, and a plurality of evaporator fin portions 414. The upper tank portion 411 is disposed above the lower tank portion 412 in the vertical direction G.

The connecting pipe portion 413 of the evaporator 410 connects the upper tank portion 411 and the lower tank portion 412. The connecting pipe portion 413 is provided in plurality.

The evaporator fin portion 414 is disposed between the respective connecting pipe portions 413. These evaporator fin portions 414 deprive heat from air in a high temperature state, and transmits the received heat to coolant COO within the connecting pipe portions 413. The coolant COO that has received the heat changes from a liquid phase state to a vapor phase state, and rises in the connecting pipe portions 413.

Note that the evaporator fin portion 414 is constituted of a plurality of fins, and is configured such that air is allowed to pass among the plurality of fins. Specifically, air is allowed to pass through an area of the evaporator fin portions 414 from one principal plane of the evaporator 410 toward the other principal plane thereof.

The steam pipe 430 connects between the upper tank portion 411 of the evaporator 410, and the condenser 420. The liquid pipe 440 connects between the lower tank portion 412 of the evaporator 410, and the condenser 420.

As illustrated in FIG. 1, the condenser 420 is provided outside the server room 100 and the machine room 200. Note that the condenser 420 may be provided within the server room 100 or the machine room 200. The condenser 420 is provided vertically above the evaporator 410 in the vertical direction G. As illustrated in FIG. 1, the condenser 420 includes a first condenser 420A and a second condenser 420B. The first condenser 420A is connected to the evaporator 410 by the steam pipe 430 and the liquid pipe 440. Further, the second condenser 420B is connected to a first freezer 530A of the freezer 530 by the first pipe 450 and the second pipe 460.

The first condenser 420A releases exhaust heat received by the evaporator 410. Specifically, the first condenser 420A receives heat of the electronic device 300 received by the evaporator 410, and releases the heat. The first condenser 420A receives the heat of the electronic device 300 from the evaporator 410 via coolant COO in a vapor phase state. A part of coolant COO in a vapor phase state within the first condenser 420A is cooled within the first condenser 420A, and changes to coolant COO in a liquid phase state. At this occasion, heat of the electronic device 300 received by the evaporator 410 is released. Further, the first condenser 420A feeds coolant COO changed to a liquid phase state within the first condenser 420A to the evaporator 410. Further, the first condenser 420A transmits heat of the electronic device 300 received by the evaporator 410 to coolant COO within the second condenser 420B. Within the second condenser 420B, coolant COO changes from a liquid phase state to a vapor phase state by the heat of the electronic device 300 received by the evaporator 410. The second condenser 420B feeds coolant COO in a vapor phase state to the first freezer 530A of the freezer 530 via the first pipe 540. Further, the second condenser 420B receives coolant COO in a liquid phase state from the first freezer 530A via the second pipe 460. Note that, generally, a plate heat exchanger or the like is used as the radiator 420.

As illustrated in FIG. 1, the steam pipe 430 connects the evaporator 410 and the first condenser 420A. Likewise, the liquid pipe 440 connects the evaporator 410 and the first condenser 420A. The steam pipe 430 and the liquid pipe 440 are used for circulating coolant COO between the evaporator 410 and the first condenser 420A. Specifically, the steam pipe 430 carries coolant COO vaporized in the evaporator 410 (coolant COO in a vapor phase state) from the evaporator 410 to the first condenser 420A. Conversely, the liquid pipe 440 carries coolant COO condensed and liquefied in the first condenser 420A (coolant COO in a liquid phase state) from the first condenser 420A to the evaporator 410. Note that, in the vertical direction G, a connecting portion of the steam pipe 430 and the first condenser 420A is disposed at a higher position than a connecting portion of the steam pipe 430 and the evaporator 410. Further, in the vertical direction G, a connecting portion of the liquid pipe 440 and the first condenser 420A is disposed at a higher position than a connecting portion of the liquid pipe 440 and the evaporator 410. Herein, a volume of coolant COO increases by about two hundred times, when the coolant COO changes from a liquid phase state to a vapor phase state. In view of the above, preferably, a pipe diameter of the steam pipe 430 is larger than a pipe diameter of the liquid pipe 440. The steam pipe 430 and the liquid pipe 440 are made of a metal such as aluminum alloy, a rubber material, or the like, for example. Note that a coupler (not illustrated) and a flange (not illustrated) are used for connecting respective members of the steam pipe 430 and the liquid pipe 440.

As illustrated in FIG. 1, the first pipe 450 connects the second condenser 420B and the first freezer 530A. Likewise, the second pipe 460 connects the second freezer 420B and the first freezer 530A. The first pipe 450 and the second pipe 460 are used for circulating coolant COO between the second condenser 420B and the first freezer 530A. The first pipe 450 carries coolant COO within the second condenser 420B from the second condenser 420B to the first freezer 530A. The second pipe 460 carries coolant COO within the first freezer 530A from the first freezer 530A to the first condenser 420A. The first pipe 450 and the second pipe 460 are made of a metal such as aluminum alloy, a rubber material, or the like, for example. Note that a coupler (not illustrated) and a flange (not illustrated) are used for connecting respective members of the first pipe 450 and the second pipe 460.

Next, an operation of the local cooler 400 is described. Herein, an operation of circulating coolant COO within a first closed space (closed space constituted of the first closed loop) to be formed by the evaporator 410, the first condenser 420A, the steam pipe 430, and the liquid pipe 440 is described. Note that an operation of circulating coolant COO within a second closed space to be formed by the first condenser 420A, the first freezer 530A, the first pipe 450, and the second pipe 460 will be described later. Likewise, an operation of circulating coolant COO within a third closed space to be formed by the second freezer 530B, the heat exchanger 520, the third pipe 540, and the fourth pipe 550 will be described later.

Herein, as illustrated in FIG. 1, the evaporator 410 is disposed vertically below the condenser 420 in the vertical direction G. In the example in FIG. 1, the evaporator 410 is disposed vertically below the first condenser 420A in the vertical direction G. Consequently, it is possible to apply a cooling method of natural circulation to the local cooler 400. Herein, a natural circulation method is a method for naturally circulating coolant COO within the local cooler 400 by using a density difference between a liquid phase and a vapor phase. Note that, when coolant COO is circulated within the local cooler 400 by using a pump (unillustrated), the evaporator 410 may not be disposed vertically below the condenser 420 in the vertical direction G.

When the local cooler 400 filled with coolant COO is placed in a room temperature environment, and when the evaporator 410 receives heat of the electronic device 300, the coolant COO boils substantially at the same time as a start of the heat reception, and vapor is generated. Consequently, a cooling structure including at least the evaporator 410, the first condenser 420A, the steam pipe 430, and the liquid pipe 440 functions as a cooling module, and starts to receive heat of the electronic device 300.

Specifically, the evaporator 410 receives heat of the electronic device 300 via air from the air conditioning blower unit 510 to be described later. When the evaporator 410 receives heat of the electronic device 300, coolant COO boils within the evaporator 410, and changes to a vapor phase state. Note that coolant COO in a vapor phase state is also referred to as vapor coolant.

Next, coolant COO in a vapor phase state within the evaporator 410 flows into the first condenser 420A through the steam pipe 430. The first condenser 420A releases heat contained in coolant COO (heat of the electronic device 300) by cooling coolant COO in a vapor phase state. The coolant COO in a vapor phase state changes to a liquid phase state by being cooled within the first condenser 420A. Further, the coolant COO cooled within the first condenser 420A changes to a liquid phase state, and flows into the evaporator 410 again via the liquid pipe 440.

In this way, coolant COO absorbs heat of the electronic device 300 from the evaporator 410 via air passing through the evaporator 410 (including heat of the electronic device 300), and successively circulates through the evaporator 410, the steam pipe 430, the first condenser 420A, and the liquid pipe 440. Thus, heat of the electronic device 300 received by the evaporator 410 is released.

As described above, the local cooler 400 cools heat received by the evaporator 410 (including heat of the electronic device 300) by circulating coolant COO between the evaporator 410 and the first condenser 420A, while changing a phase of the coolant COO (liquid phase↔vapor phase) in the first closed loop.

In the foregoing, a configuration and an operation of the local cooler 400 are described.

The air conditioner 500 includes the air conditioning blower unit 510, the heat exchanger 520, the freezer 530, the third pipe 540, the fourth pipe 550, and the control unit 560. The air conditioner 500 includes at least the heat exchanger 520 and the freezer 530. Further, the air conditioner 500 circulates coolant COO between the heat exchanger 520 and the freezer 530. Further, the air conditioner 500 supplies air for cooling the electronic device 300 to the electronic device 300 by using the air conditioning blower unit 510. Further, the air conditioner 500 cools air within the machine room 200.

Further, the freezer 530 of the air conditioner 500 releases, to the outside, heat of the electronic device 300 received from the condenser 420 and the heat exchanger 520 via coolant COO.

As illustrated in FIG. 1, the air conditioning blower unit 510 is provided within the machine room 200 of the housing 900. More specifically, the air conditioning blower unit 510 is provided within the second accommodation unit 202 of the machine room 200. The air conditioning blower unit 510 supplies air for cooling the electronic device 300 to the electronic device 300 along the arrow A. The air conditioning blower unit 510 is disposed in such a way as to face the electronic device 300 with the second opening portion 204 therebetween. Thus, air fed from the air conditioning blower unit 510 is efficiently supplied to the electronic device 300. Note that, generally, a blower is a device whose pressure ratio is about 1.1 to 2 among blower units (including a fan and a blower).

As illustrated in FIG. 1, the heat exchanger 520 is provided within the machine room 200 of the housing 900. More specifically, the heat exchanger 520 is provided within the first accommodation unit 201 of the machine room 200. The heat exchanger 520 is connected to the second freezer 530B of the freezer 530 via the third pipe 540 and the fourth pipe 550. The heat exchanger 520 receives exhaust heat of the electronic device 300. Further, the heat exchanger 520 receives heat contained in air within the machine room 200 via coolant COO. Further, the heat exchanger 520 feeds coolant COO that has absorbed heat to the second freezer 530B via the third pipe 540. Further, the heat exchanger 520 receives coolant COO cooled by the second freezer 530B via the fourth pipe 550.

As illustrated in FIG. 1, the freezer 530 is provided outside the server room 100 and the machine room 200. The freezer 530 includes the first freezer 530A and the second freezer 530B. The first freezer 530A is connected to the second condenser 420B via the first pipe 450 and the second pipe 460. The second freezer 530B is connected to the heat exchanger 520 via the third pipe 540 and the fourth pipe 550.

The first freezer 530A releases heat received by the condenser 420. The first freezer 530A receives coolant COO that has absorbed heat from the condenser 420 via the first pipe 450. The first freezer 530A cools the received coolant COO. Further, the first freezer 530A returns the cooled coolant COO to the second condenser 420B again via the second pipe 460.

The second freezer 530B releases heat received by the heat exchanger 520. The second freezer 530B receives coolant COO, that has absorbed heat, from the heat exchanger 520 via the third pipe 540. The second freezer 530B cools the received coolant COO. Further, the second freezer 530B returns the cooled coolant COO to the heat exchanger 520 again.

As illustrated in FIG. 1, the third pipe 540 connects between the heat exchanger 520 and the second freezer 530B. The third pipe 540 carries coolant COO within the heat exchanger 520 from the heat exchanger 520 to the second freezer 530B.

As illustrated in FIG. 1, the fourth pipe 550 connects between the heat exchanger 520 and the second freezer 530B. The fourth pipe 550 carries coolant COO within the second freezer 530B from the second freezer 530B to the heat exchanger 520.

Herein, an operation of circulating coolant COO within a second closed space (closed space constituted of the second closed loop) to be formed by the second condenser 420B, the first freezer 530A, the first pipe 450, and the second pipe 460 is described.

The second condenser 420B receives, from the first condenser 420A, heat of the electronic device 300 transmitted from the evaporator 410 to the first condenser 420A in the first closed loop via coolant COO within the second condenser 420B. At this occasion, coolant COO within the second condenser 420B in the second closed loop changes from a liquid phase state to a vapor phase state by the heat of the electronic device 300. In the second closed loop, the second condenser 420B feeds coolant COO in a vapor phase state to the first freezer 530A via the first pipe 450. Specifically, coolant COO in a vapor phase state within the second radiation 420B flows into the first freezer 530A through the first pipe 450. Within the first freezer 530A, heat contained in coolant COO (heat of the electronic device 300) is released by cooling coolant COO in a vapor phase state. The coolant COO in a vapor phase state changes to a liquid phase state by being cooled within the first freezer 530A. Further, the coolant COO cooled within the first freezer 530A flows into the second condenser 420B through the second pipe 460 in a liquid phase state.

In this way, coolant COO successively circulates through the second condenser 420B, the first pipe 450, the first freezer 530A, and the second pipe 460. Thus, heat of the electronic device 300 received by the evaporator 410 is released by the first freezer 530A via the second condenser 420B.

As described above, by circulating coolant COO between the second condenser 420B and the first freezer 530A in the second closed loop while changing a phase of the coolant COO (liquid phase↔vapor phase), heat received by the evaporator 410 (including heat of the electronic device 300) is cooled.

Next, an operation of circulating coolant COO within a third closed space (closed space constituted of the third closed loop) to be formed by the heat exchanger 420, the second freezer 530B, the third pipe 540, and the fourth pipe 550 is described.

The heat exchanger 520 receives exhaust heat of the electronic device 300. Further, the heat exchanger 520 receives heat contained in air within the machine room 200 via coolant COO. At this occasion, coolant COO within the heat exchanger 520 in the third closed loop changes from a liquid phase state to a vapor phase state by heat of the electronic device 300 and the like. Further, the heat exchanger 520 feeds coolant COO in a vapor phase that has absorbed heat to the second freezer 530B via the third pipe 540. Specifically, coolant COO in a vapor phase state within the heat exchanger 520 flows into the second freezer 530B through the third pipe 540. Within the second freezer 530B, by cooling coolant COO in a vapor phase state, heat contained in the coolant COO (heat of the electronic device 300 and the like) is released. The coolant COO in a vapor phase state changes to a liquid phase state by being cooled within the second freezer 530B. Further, the coolant COO cooled within the second freezer 530B flows into the heat exchanger 520 through the fourth pipe 550 in a liquid phase state.

In this way, coolant COO successively circulates through the heat exchanger 520, the third pipe 540, the second freezer 530B, and the fourth pipe 550. Thus, exhaust heat and the like of the electronic device 300 are released by the second freezer 530B.

As described above, by circulating coolant COO between the heat exchanger 520 and the second freezer 530B in the third closed loop while changing a phase of the coolant COO (liquid phase↔vapor phase), exhaust heat and the like of the electronic device 300 are cooled. Note that, in the second and third closed loops, generally, water is used as coolant COO. When water is used as coolant COO, the above-described phase changes do not occur.

As illustrated in FIG. 1, the control unit 560 is provided outside the server room 100 and the machine room 200. More specifically, the control unit 560 is provided on atop of the server room 100. Note that the control unit 560 may be provided within the server room 100 or the machine room 200. Further, the control unit 560 may be installed in a local room installed in the server room 100 and the like. Further, the control unit 560 may be provided in a cloud system (not illustrated) on a network (not illustrated). The control unit 560 is connected to the air conditioning blower unit 510, the freezer 530, a first temperature detection unit 610, and a second temperature detection unit 620. The control unit 560 controls operations of the air conditioning blower unit 510 and the freezer 530. A function and the like of the control unit 560 will be described later.

Further, as illustrated in FIG. 1, the first temperature detection unit 610 and the second temperature detection unit 620 are provided in the cooling apparatus 1000.

The first temperature detection unit 610 is provided between the electronic device 300 and the air conditioning blower unit 510. The first temperature detection unit 610 is connected to the control unit 560. The first temperature detection unit 610 detects a supply temperature Ta being a temperature of air supplied from the air conditioning blower unit 510 of the air conditioner 500 to the electronic device 300. The first temperature detection unit 610 outputs a detection value of the supply temperature Ta to the control unit 560. A supply temperature is also referred to as an intake air temperature.

The second temperature detection unit 620 is provided outside the server room 100 and the machine room 200. The second temperature detection unit 620 is connected to the control unit 560. The second temperature detection unit 620 detects an ambient temperature To being a temperature of air outside the server room 100 and the machine room 200. The second temperature detection unit 620 outputs a detection value of the ambient temperature To to the control unit 560.

Figure 3:
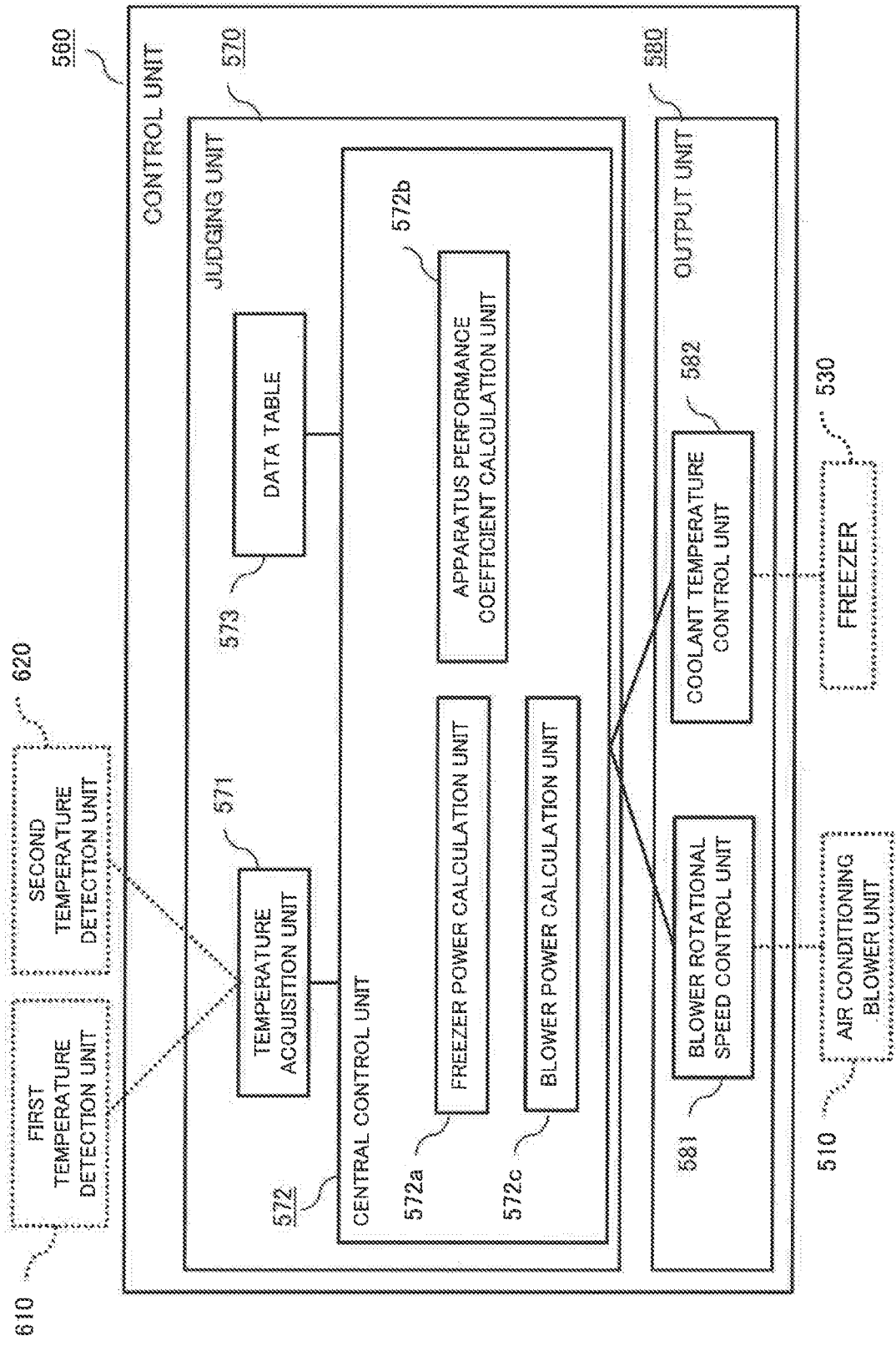
FIG. 3 is a block diagram illustrating a configuration of a control unit.

Next, a configuration of the control unit 560 is described in detail. FIG. 3 is a block diagram illustrating a configuration of the control unit 560.

As illustrated in FIG. 3, the control unit 560 includes a judging unit 570 and an output unit 580.

As illustrated in FIG. 3, the judging unit 570 includes a temperature acquisition unit 571, a central control unit 572, and a data table 573.

The temperature acquisition unit 571 is connected to the first temperature detection unit 610, the second temperature detection unit 620, and the central control unit 572. The temperature acquisition unit 571 acquires the supply temperature Ta detected by the first temperature detection unit 610, and the ambient temperature To detected by the second temperature detection unit 620. The temperature acquisition unit 571 outputs the supply temperature Ta and the ambient temperature To to the central control unit 572.

As illustrated in FIG. 3, the central control unit 572 is connected to the temperature acquisition unit 571, the output unit 580, and the data table 573. The central control unit 572 controls the entirety of the control unit 560. The central control unit 572 accesses to data stored in the data table 573.

The central control unit 572 includes a freezer power calculation unit 572a, an apparatus performance coefficient calculation unit 572b, and a blower power calculation unit 572c.

The freezer power calculation unit 572a acquires power consumption Wc of the freezer 530, based on a heat exchanging amount Q of the electronic device 300 and a performance coefficient COP_c of the freezer 530. A specific function of the freezer power calculation unit 572a will be described in detail in the following operation description.

The apparatus performance coefficient calculation unit 572b acquires an apparatus performance coefficient ACOP (Apparatus's COP), based on the calorific value Q of the electronic device 300, the power consumption Wc of the freezer 530, and power consumption Wf of the air conditioning blower unit 510. The apparatus performance coefficient ACOP is a performance coefficient of an apparatus (herein, the cooling apparatus 1000) including the evaporator 410, the condenser 420, the heat exchanger 520, the freezer 530, and the air conditioning blower unit 510. A specific function of the apparatus performance coefficient calculation unit 572b will be described in detail in the following operation description.

Note that COP is generally one of indexes (coefficients) representing energy consumption efficiency of a cooler and the like, and is a dimensionless numerical value calculated as a ratio of cooling ability or heating ability with respect to energy consumption (COP=[cooling ability or heating ability]/[energy consumption]). Specifically, COP is a value representing cooling ability or heating ability per 1 kW of power consumption.

The apparatus performance coefficient ACOP is an index (coefficient) of energy consumption efficiency of an apparatus (herein, the cooling apparatus 1000) including the evaporator 410, the condenser 420, the heat exchanger 520, the freezer 530, and the air conditioning blower unit 510, and is a value representing cooling ability of the cooling apparatus 1000 per 1 kW of power consumption.

The blower power calculation unit 572c calculates the power consumption Wf of the air conditioning blower unit 510, based on rotational speed r of the air conditioning blower unit 510. A specific function of the blower power calculation unit 572c will be described later in the following operation description.

The data table 573 is connected to the central control unit 572. The data table 573 functions as a storage unit. A parameter and the like for calculating the apparatus performance coefficient ACOP and the like are stored in the data table 573, for example.

The output unit 580 includes a blower rotational speed control unit 581 and a coolant temperature control unit 582. The blower rotational speed control unit 581 controls the rotational speed r of the air condition blower unit 510, based on the apparatus performance coefficient ACOP. The coolant temperature control unit 582 controls a first coolant temperature Tin being a temperature of coolant COO flowing from the freezer 530, based on the apparatus performance coefficient ACOP. Note that A first coolant temperature is also referred to as a coolant discharge temperature.

Next, an operation of the cooling apparatus 1000 is described.

When the cooling apparatus 1000 is operated, the electronic device 300, the local cooler 400, the air conditioner 500, and the like are operated. Heat of the electronic device 300 is cooled by the local cooler 400 and the air conditioner 500.

In the first closed loop, the evaporator 410 receives heat of the electronic device 300 via air from the air conditioning blower unit 510. Further, the evaporator 410 transmits the heat received from the electronic device 300 to the first condenser 420A via coolant COO circulating between the evaporator 410 and the first condenser 420A. The first condenser 420A releases a part of the heat of the electronic device 300. Further, the first condenser 420A transmits a part of the heat of the electronic device 300 to coolant COO within the second condenser 420B included in the second closed loop.

In the second closed loop, the second condenser 420B receives heat of the electronic device 300 via coolant COO in a vapor phase state from the evaporator 410 in the first closed loop. At this occasion, coolant COO within the second condenser 420B in the second closed loop changes from a liquid phase state to a vapor phase state by the heat of the electronic device 300. In the second closed loop, the second condenser 420B feeds coolant COO in a vapor phase state to the first freezer 530A via the first pipe 450. Specifically, coolant COO in a vapor phase state within the second radiation 420B flows into the first freezer 530A through the first pipe 450. By cooling coolant COO in a vapor phase state, the first freezer 530A releases heat contained in the coolant COO (heat of the electronic device 300). The coolant COO in a vapor phase state changes to a liquid phase state by being cooled within the first freezer 530A. Further, coolant COO cooled within the first freezer 530A flows into the second condenser 420B through the second pipe 460 in a liquid phase state.

In the air conditioner 500, the air conditioning blower unit 510 supplies air for cooling the electronic device 300 to the electronic device 300 along the arrow A. Thus, the electronic device 300 is cooled by air from the air conditioning blower unit 510. Note that the air conditioning blower unit 510 is controlled by the control unit 560. Air by the air conditioning blower unit 510 contains exhaust heat of the electronic device 300, and is supplied to the evaporator 410 along the arrow B. A part of air supplied to the evaporator 410 passes through the evaporator 410, and flows upward in the vertical direction G as illustrated by the arrow C. Thereafter, a part of air passing through the evaporator 410 collides against a wall (ceiling) on the upper side of the server room 100 in the vertical direction G, and flows in directions of the arrow D and the arrow E. Further, a part of air passing through the evaporator 410 flows into the machine room 200 via the first opening portion 203. In the machine room 200, a part of air passing through the evaporator 410 flows into the heat exchanger 520 of the air conditioner 500 by a suction force of the air conditioner 500, as illustrated by the arrow F.

Further, in the third closed loop, the heat exchanger 520 receives exhaust heat of the electronic device 300. Further, the heat exchanger 520 receives heat contained in air within the machine room 200 via coolant COO. At this occasion, coolant COO within the heat exchanger 520 in the third closed loop changes from a liquid phase state to a vapor phase state by the heat of the electronic device 300 and the like. Further, the heat exchanger 520 feeds coolant COO in a vapor phase state that has absorbed the heat to the second freezer 530B via the third pipe 540. Specifically, coolant COO in a vapor phase state within the heat exchanger 520 flows into the second freezer 530B through the third pipe 540. Within the second freezer 530B, heat contained in coolant COO (heat of the electronic device 300 and the like) is released by cooling the coolant COO in a vapor phase state. The coolant COO in a vapor phase state changes to a liquid phase state by being cooled within the second freezer 530B. Further, the coolant COO cooled in the second freezer 530B flows into the heat exchanger 520 through the fourth pipe 550 in a liquid phase state.

Herein, the air conditioner 500 cools air that circulates within the housing 900 along the arrows A to F. Specifically, the air conditioner 500 absorbs heat that is not absorbed by the local cooler 400 among exhaust heat discharged from the electronic device 300, and cools the electronic device 300.

Further, air within the housing 900 successively circulates along the arrows A to F. Therefore, warm air (exhaust heat) discharged from the electronic device 300 along the arrow B is subjected to heat exchange by the air conditioner 500, after the heat is absorbed by the local cooler 400.

Figure 4:
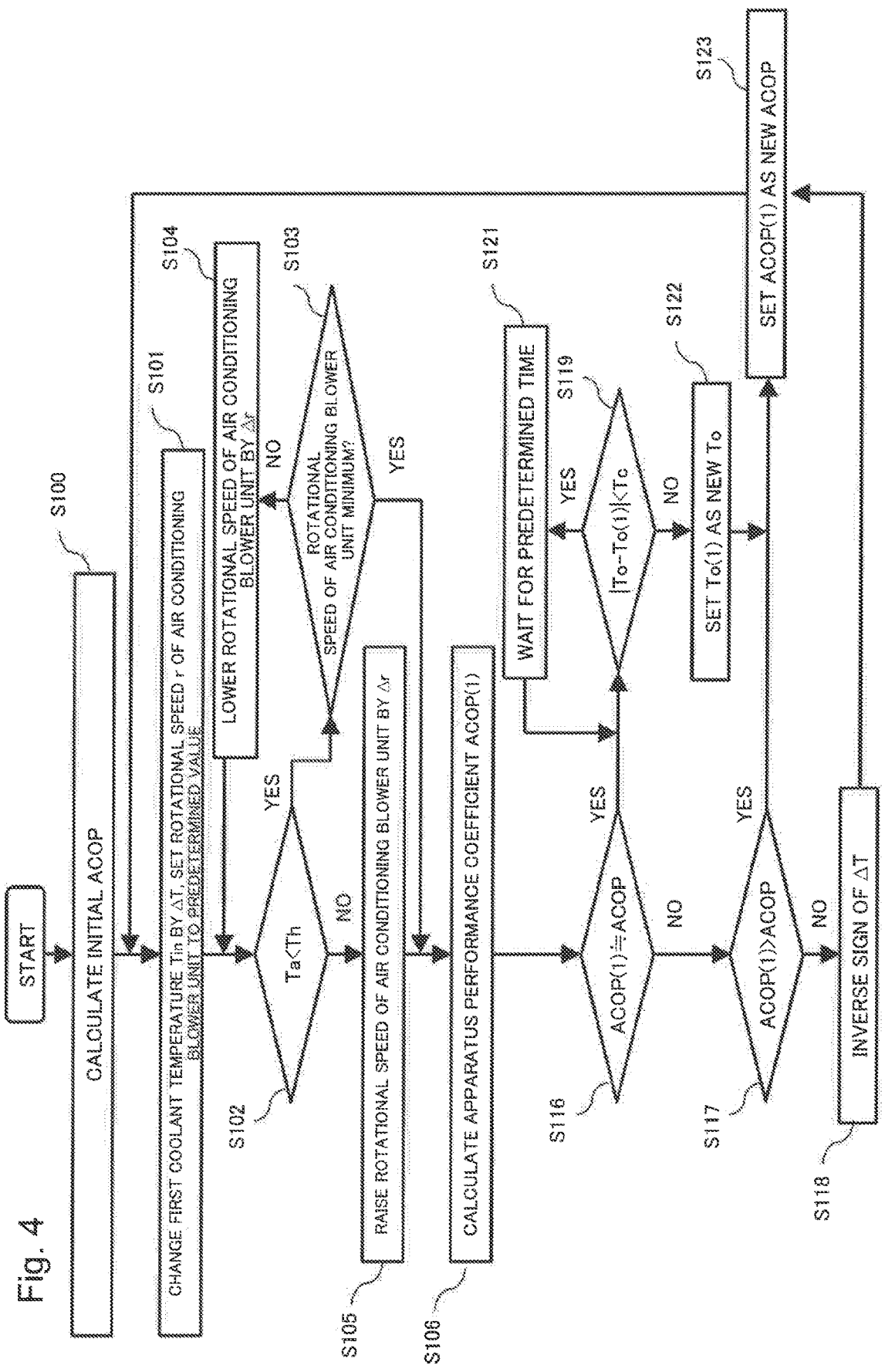
FIG. 4 is a control flow diagram of a cooling apparatus in the first example embodiment of the present invention.

Next, a control method of the cooling apparatus 1000 is described. FIG. 4 is a control flow diagram of the cooling apparatus 1000.

As illustrated in FIG. 4, first of all, the apparatus performance coefficient calculation unit 572b of the control unit 560 calculates an initial ACOP (STEP (hereinafter, simply referred to as S) 100).

Figure 5:
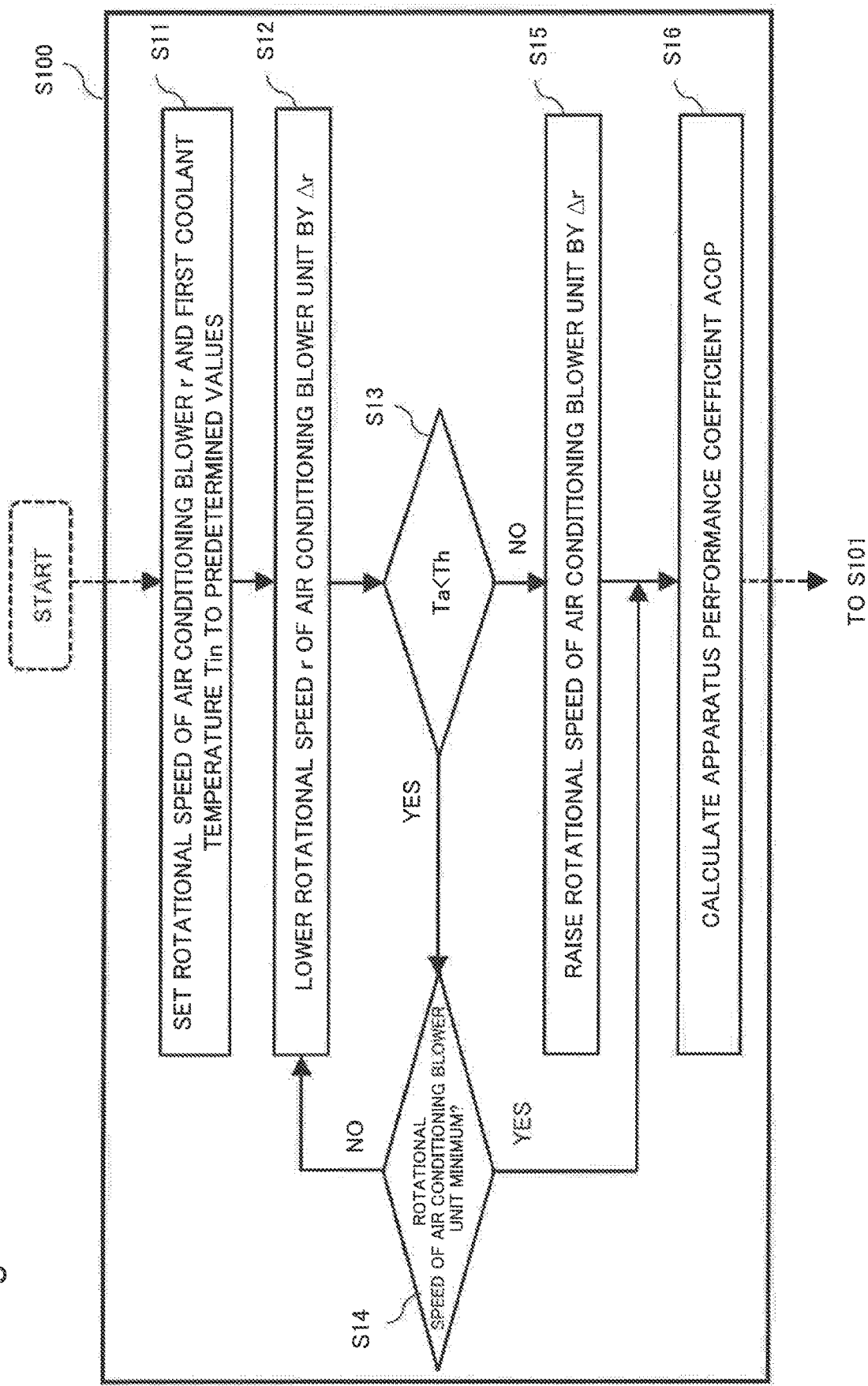
FIG. 5 is a control flow diagram of the cooling apparatus in the first example embodiment of the present invention.

FIG. 5 is a part of a control flow diagram of the cooling apparatus 1000, and is a flow diagram illustrating processing of S100 in FIG. 5.

As illustrated in FIG. 5, the central control unit 572 sets the rotational speed r of the air conditioning blower unit 510 and the first coolant temperature (coolant discharge temperature) Tin to predetermined values (S11). Specifically, the blower rotational speed control unit 581 sets, for example, a maximum value of a rotational speed of the air conditioning blower unit 510 as a predetermined value. Further, the coolant temperature control unit 582 sets, for example, a minimum value of the first coolant temperature as a predetermined value.

Next, the blower rotational speed control unit 581 lowers the rotational speed r of the air conditioning blower unit 510 from the predetermined value set in S11 by $\Delta r$ (where $\Delta r > 0$) (S12).

Further, the central control unit 572 judges whether or not the supply temperature Ta is smaller than an upper limit threshold value Th of the supply temperature Ta (S13).

When the central control unit 572 judges that the supply temperature Ta is smaller than the upper limit threshold value Th of the supply temperature Ta (YES in S13), the central control unit 572 judges whether or not the rotational speed r of the air conditioning blower unit 510 is a minimum value (S14).

When the central control unit 572 judges that the supply temperature Ta is not smaller than the upper limit threshold value Th of the supply temperature Ta (NO in S13), the blower rotational speed control unit 581 raises the rotational speed r of the air conditioning blower unit 510 by $\Delta r$ (S15).

Next, the apparatus performance coefficient calculation unit 572b calculates the apparatus performance coefficient ACOP (S16).

Specifically, first of all, the blower power calculation unit 572c calculates power consumption Wf0 of the air conditioning blower unit 510, based on a rotational speed r0 of the air conditioning blower unit 510 set in S15. Note that r0 corresponds to r target in FIG. 7.

Herein, first of all, the central control unit 572 acquires the rotational speed r0 of the air conditioning blower unit 510 from the blower rotational speed control unit 581.

Thereafter, the blower power calculation unit 572c of the central control unit 572 calculates the power consumption Wf0 of the air conditioning blower unit 510, after waiting for a predetermined time (e.g. about one minute) until cooling performance is stabilized.

Figure 6:
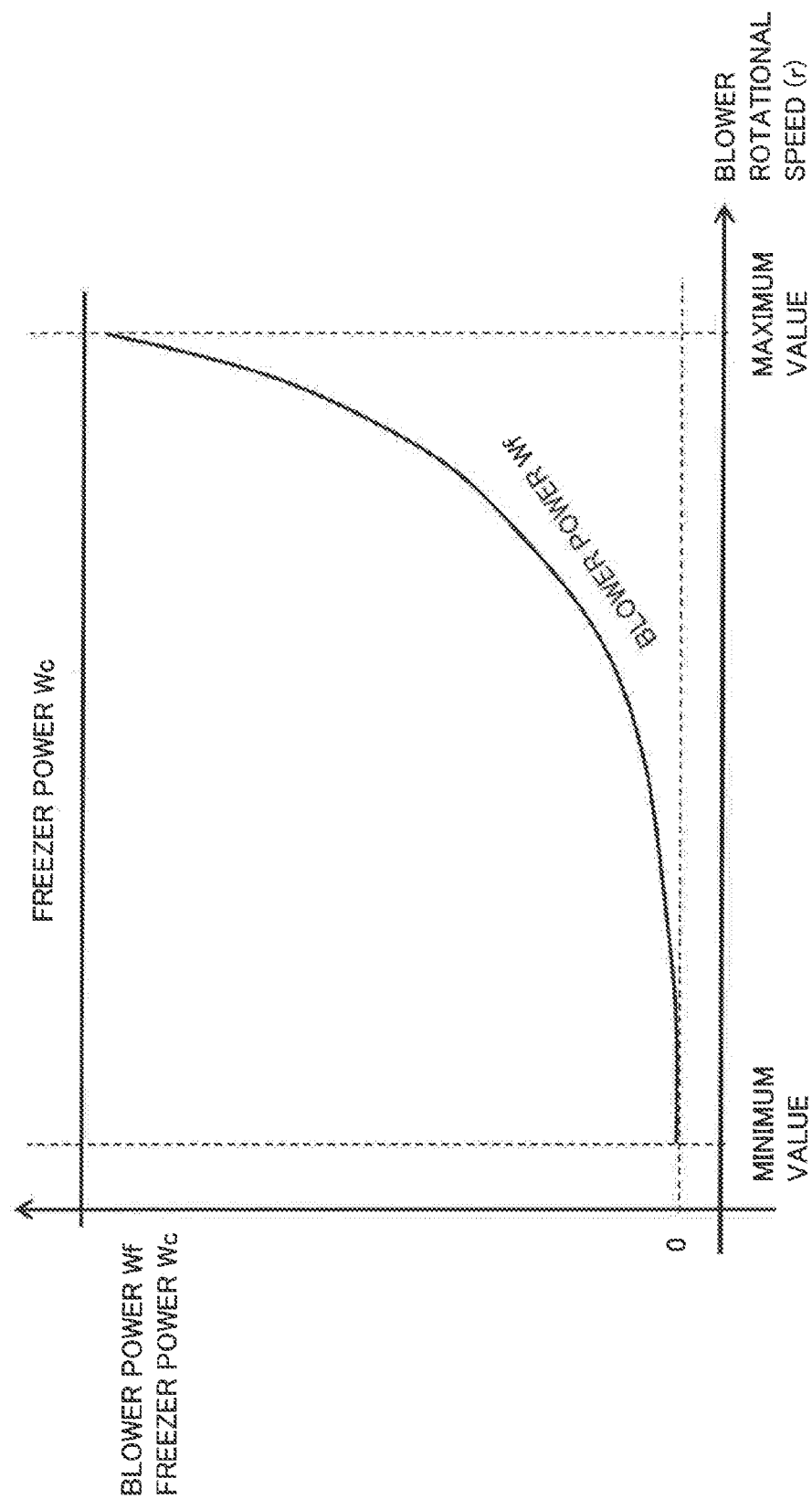
FIG. 6 is a diagram illustrating a relationship between power consumption of an air conditioning blower unit and power consumption of a freezer, at a specific ambient temperature and a specific first coolant temperature.

FIG. 6 is a diagram illustrating a relationship between the power consumption Wf of the air conditioning blower unit 510 and the power consumption Wc of a freezer, at the specific ambient temperature To and the specific first coolant temperature Tin, and the blower rotational speed r.

When the calorific value Q of the electronic device 300 is a constant value, as illustrated in FIG. 6, power consumption (freezer power) Wc of a freezer has a constant value and does not change, even when a blower rotational speed (rotational speed of the air conditioning blower unit 510) changes. The power (blower power) Wf0 of the air conditioning blower unit 510 is proportional to the cube of a blower rotational speed (rotational speed of the air conditioning blower unit 510).

A calculation formula of the power consumption Wf0 of the air conditioning blower unit 510 is expressed as Eq. (1) by using a rated power value Wf_max of the air conditioning blower unit 510, the rotational speed r0 of the air conditioning blower unit 510, and a maximum rotational speed r_max of the air conditioning blower unit 510.

$$Wf0 = Wf\_max \times (r0/r\_max)^3 \qquad \text{Eq. (1)}$$

Further, regarding the power consumption Wf0 of the air conditioning blower unit 510, a value calculated in advance by an experiment may be stored in the data table 573. In this case, the blower power calculation unit 572c may also acquire the power consumption Wf0 of the air conditioning blower unit 510 stored in the data table 573, in place of calculating the power consumption Wf0 of the air conditioning blower unit 510 by using Eq. (1).

Next, the freezer power calculation unit 572a acquires power consumption Wc0 of the freezer 530 by using Eq. (2), based on the heat exchanging amount Q of the electronic device 300, and a performance coefficient COP_c0 of the freezer 530. At this occasion, it is assumed that the performance coefficient COP_c0 of the freezer 530 is stored in advance in the data table 573 in association with the predetermined first coolant temperature Tin and the ambient temperature To. Note that the calorific value Q of the electronic device 300 is a constant value.

$$Wc0 = Q/COP\_c0 \qquad \text{Eq. (2)}$$

Further, the apparatus performance coefficient calculation unit 572b acquires the apparatus performance coefficient ACOP by using Eq. (3), based on the calorific value Q of the electronic device 300, the power consumption Wc of the freezer 530, and the power consumption Wf0 of the air conditioning blower unit 510. Herein, it is assumed that the apparatus performance coefficient ACOP to be calculated is an initial ACOP. As Wf0 and Wc0 in Eq. (3), values calculated by Eq. (1) and Eq. (2) are employed.

$$ACOP = Q/(Wf0 + Wc0) \qquad \text{Eq. (3)}$$

As described above, the cooling apparatus 1000 calculates the apparatus performance coefficient ACOP in S16.

Referring back to FIG. 5, when the central control unit 572 judges that the rotational speed r of the air conditioning blower unit 510 is a minimum value (YES in S14), the cooling apparatus 1000 performs processing of S16.

When the central control unit 572 judges that the rotational speed r of the air conditioning blower unit 510 is not a minimum value (NO in S14), the cooling apparatus 1000 performs processing of S12.

Next, referring back to FIG. 4, processing of S101 and thereafter is described.

Figure 7:
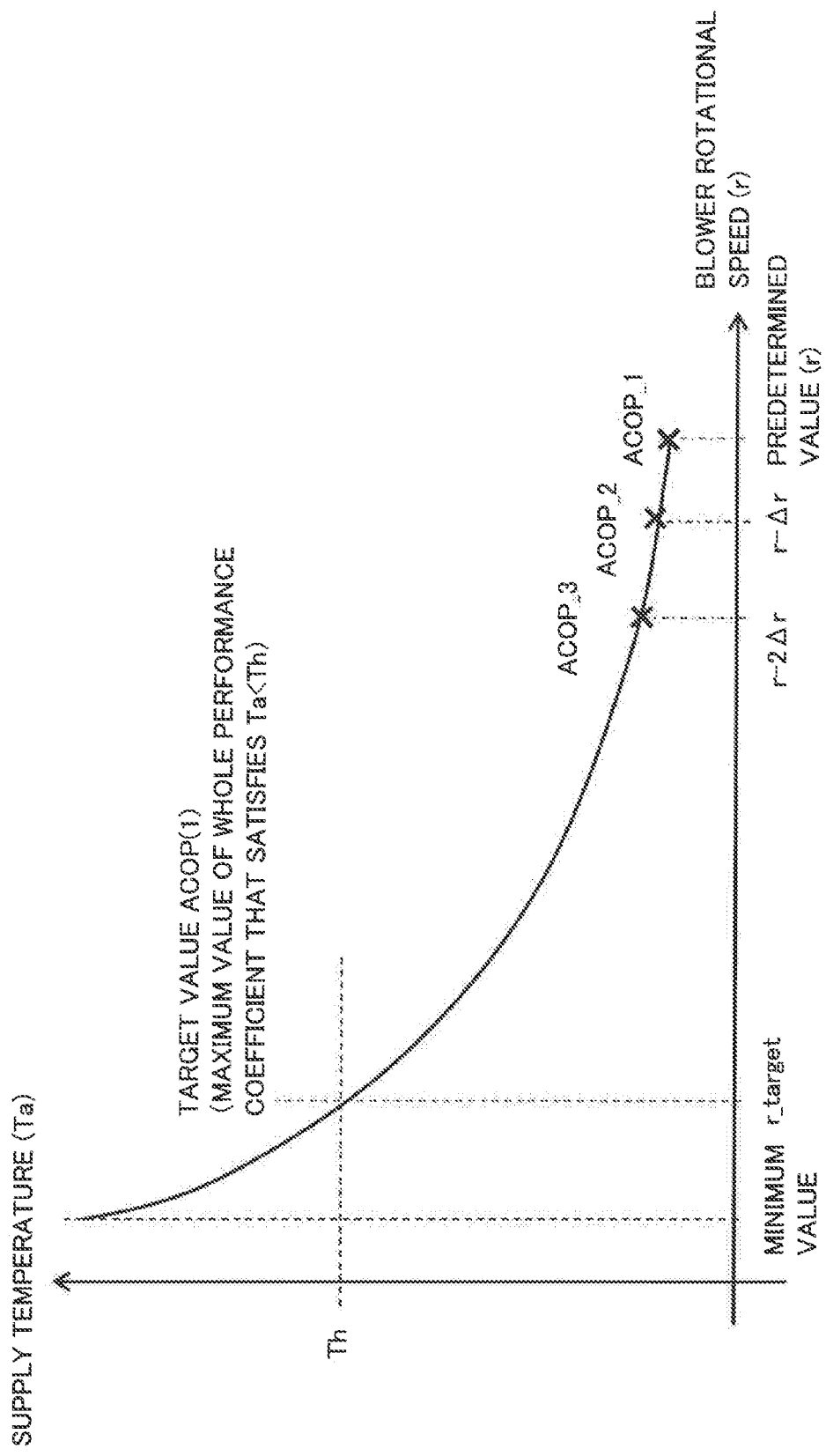
FIG. 7 is a diagram illustrating a relationship between a rotational speed and a supply temperature of the air conditioning blower unit, at the specific ambient temperature and the specific first coolant temperature.

Herein, FIG. 7 is a diagram illustrating a relationship between the rotational speed (blower rotational speed) r of the air conditioning blower unit 510 and the supply temperature Ta, at the specific ambient temperature To and the specific first coolant temperature Tin. Note that a supply temperature is also referred to as an intake air temperature.

As illustrated in FIG. 7, the supply temperature Ta tends to decrease in inverse proportion, as the rotational speed (blower rotational speed) r of the air conditioning blower unit 510 increases. FIG. 7 illustrates an apparatus performance coefficient ACOP_1 associated with a predetermined value (r) of a rotational speed of the air conditioning blower unit 510. Likewise, FIG. 7 illustrates an apparatus performance coefficient ACOP_2 associated with a rotational speed (r−Δr) of the air conditioning blower unit 510. Further, FIG. 7 illustrates an apparatus performance coefficient ACOP_3 associated with a rotational speed (r−2Δr) of the air conditioning blower unit 510.

Herein, it is assumed that a maximum value of ACOP when the supply temperature Ta is smaller than the upper limit threshold value Th of the supply temperature Ta (Ta<Th) is a target ACOP(1) of an apparatus performance coefficient. Further, the cooling apparatus 1000 performs control of achieving r_target, being a blower rotational speed (rotational speed of the air conditioning blower unit 510) at which the supply temperature Ta becomes smaller than the upper limit threshold value Th of the supply temperature Ta (Ta<Th) and ACOP becomes maximum (S101 to S106 in FIG. 4).

As illustrated in FIG. 4, after processing of S100, the cooling apparatus 1000 raises the first coolant temperature Tin by ΔT. Further, the cooling apparatus 1000 sets the rotational speed r of the air conditioning blower unit 510 to the predetermined value (r) (S101). The predetermined value herein is set to a value close to a maximum value of the rotational speed r of the air conditioning blower unit 510, as illustrated in FIG. 6, for example.

Specifically, the coolant temperature control unit 582 raises the first coolant temperature T by ΔT. Further, the blower rotational speed control unit 581 sets the rotational speed r to the above-described predetermined value.

Next, the central control unit 572 judges whether or not the supply temperature Ta is smaller than the upper limit threshold value Th of the supply temperature Ta (S102).

When the central control unit 572 judges that the supply temperature Ta is smaller than the upper limit threshold value Th of the supply temperature Ta (YES in S102), the central control unit 572 judges whether or not the rotational speed r of the air conditioning blower unit 510 is a minimum value (S103).

When the central control unit 572 judges that the supply temperature Ta is not smaller than the upper limit threshold value Th of the supply temperature Ta (NO in S102), the blower rotational speed control unit 581 raises the rotational speed r of the air conditioning blower unit 510 by Δr (S105). It is assumed that a rotational speed of the air conditioning blower unit 510 after being raised by Δr is r1.

When the central control unit 572 judges that the rotational speed r of the air conditioning blower unit 510 is a minimum value (YES in S103), the cooling apparatus 1000 performs processing of S106.

When the central control unit 572 judges that the rotational speed r of the air conditioning blower unit 510 is not a minimum value (NO in S103), the blower rotational speed control unit 581 performs control of lowering the rotational speed r of the air conditioning blower unit 510 by Δr (S104). The air conditioning blower unit 510 lowers the rotational speed r of the air conditioning blower unit 510 by Δr in accordance with control of the blower rotational speed control unit 581.

Next, similarly to S16, the cooling apparatus 1000 calculates the apparatus performance coefficient ACOP(1) (S106). Note that, herein, when it is necessary to distinguish respective parameters used in Eq. (1) to Eq. (3), a subscript (1) is attached behind respective parameters. Note that ACOP(1) is associated with a case where a blower rotational speed is set to r1. Note that r1 corresponds to r target in FIG. 7.

Specifically, first of all, the blower power calculation unit 572c calculates power consumption Wf1 of the air conditioning blower unit 510, based on the rotational speed r1 of the air conditioning blower unit 510 set in S105.

Herein, first of all, the central control unit 572 acquires the rotational speed r1 of the air conditioning blower unit 510 from the blower rotational speed control unit 581.

Thereafter, the blower power calculation unit 572c of the central control unit 572 calculates the power consumption Wf1 of the air conditioning blower unit 510, after waiting for a predetermined time (e.g. about one minute) until cooling performance is stabilized.

A calculation formula of the power consumption Wf1 of the air conditioning blower unit 510 is expressed as Eq. (4) by using the rated power value Wf_max of the air conditioning blower unit 510, the rotational speed r1 of the air conditioning blower unit 510, and the maximum rotational speed r_max of the air conditioning blower unit 510. Wf1 corresponds to Wf when a rotational speed (blower rotational speed) of the air conditioning blower unit 510 is set to r1. Eq. (4) is in conformity with Eq. (1).

$$Wf1 = Wf\_max(r1/r\_max)^3 \qquad \text{Eq. (4)}$$

Further, regarding the power consumption Wf1 of the air conditioning blower unit 510, a value calculated in advance by an experiment may be stored in the data table 573. In this case, the blower power calculation unit 572c may also acquire the power consumption Wf1 of the air conditioning blower unit 510 stored in the data table 573, in place of calculating the power consumption Wf1 of the air conditioning blower unit 510 by using Eq. (4).

Next, the freezer power calculation unit 572a acquires the power consumption Wc of the freezer 530 by using Eq. (5), based on the heat exchanging amount Q of the electronic device 300, and a performance coefficient COP_c1 of the freezer 530. At this occasion, it is assumed that the performance coefficient COP_c1 of the freezer 530 is stored in advance in the data table 573 in association with the first coolant temperature Tin+ΔT and the ambient temperature To. The central control unit 572 acquires the apparatus coefficient COP_c1 of the freezer 530 from the data table 573. Note that the calorific value Q of the electronic device 300 is a constant value. The calorific value Q of the electronic device 300 is known in advance from a catalog and the like, and is stored in advance in the data table 573, for example. Wc1 corresponds to Wc when a fan rotational speed is set to r1. Eq. (5) is in conformity with Eq. (2).

$$Wc = Q/COP\_c1 \qquad \text{Eq. (5)}$$

Further, the apparatus performance coefficient calculation unit 572b calculates the apparatus performance coefficient ACOP(1) by using Eq. (6), based on the calorific value Q of the electronic device 300, the power consumption Wc1 of the freezer 530, and the power consumption Wf1 of the air conditioning blower unit 510. As Wf1 and Wc1 in Eq. (6), values calculated by Eq. (4) and Eq. (5) are employed. As described above, the calorific value Q of the electronic device 300 is a constant value. The calorific value Q of the electronic device 300 is known in advance from a catalog and the like, and is stored in advance in the data table 573, for example. Eq. (6) is in conformity with Eq. (3).

$$ACOP(1)=Q/(Wf1+Wc1) \qquad \text{Eq. (6)}$$

As described above, the cooling apparatus 1000 calculates the apparatus performance coefficient ACOP(1) in S106.

Next, the central control unit 572 judges whether or not the apparatus performance coefficient ACOP(1) and the apparatus performance coefficient ACOP have substantially same values (S116). Herein, when an absolute value of a difference value between the apparatus performance coefficient ACOP(1) and the apparatus performance coefficient ACOP is equal to or smaller than 0.1 (|ACOP(1)−ACOP|<0.1), the central control unit 572 judges that the apparatus performance coefficient ACOP(1) and the apparatus performance coefficient ACOP have substantially same values (ACOP(1)≈ACOP).

When the central control unit 572 judges that the apparatus performance coefficient ACOP(1) and the apparatus performance coefficient ACOP have substantially same values (YES in S116), the central control unit 572 judges whether or not an absolute value of a difference value between an ambient temperature To(1) and the ambient temperature To is smaller than a threshold value Tc (|To−To(1)|<Tc) (S119). Further, the threshold value Tc is determined to be a temperature difference when performance of the local cooler 400 changes. Herein, it is assumed that the threshold value Tc is 3° C., for example.

When the central control unit 572 judges that an absolute value of a difference value between the ambient temperature To and the ambient temperature To(1) is smaller than the threshold value Tc (YES in S119), the central control unit 572 waits for a predetermined time (e.g. ten minutes) (S121), and repeatedly performs processing of S119. Specifically, when an absolute value of a difference value between the ambient temperature To and the ambient temperature To(1) is smaller than the threshold value Tc, the central control unit 572 judges that a magnitude of a change amount of the ambient temperature To (|To−To(1)|) does not reach a temperature difference at which performance of the cooling apparatus 1000 changes. Further, the central control unit 572 judges that a rotational speed (blower rotational speed) of the air conditioning blower unit 510 at this time is optimum.

On the other hand, when the central control unit 572 judges that an absolute value of a difference value between the ambient temperature To and the ambient temperature To(1) is not smaller than the threshold value Tc (NO in S119), the central control unit 572 writes the ambient temperature To(1) as a new ambient temperature in the data table 573 (Step S122). Thereafter, the central control unit 572 writes the apparatus performance ACOP(1) as a new apparatus performance coefficient in the data table 573 (Step S123). Specifically, when an absolute value of a difference value between the ambient temperature To and the ambient temperature To(1) is not smaller than the threshold value Tc, the central control unit 572 judges that a magnitude of a change amount of the ambient temperature To (|To−To(1)|) reaches a temperature difference at which performance of the cooling apparatus 1000 changes. Further, the central control unit 572 judges that a rotational speed (blower rotational speed) of the air conditioning blower unit 510 and a coolant discharge temperature (first coolant temperature) Tin of the freezer 530 at this time are not optimum, and performs processing of S101 again.

When the central control unit 572 judges that the apparatus performance coefficient ACOP(1) and the apparatus performance coefficient ACOP do not have substantially same values (NO in S116), the central control unit 572 judges whether or not the apparatus performance coefficient ACOP(1) is larger than the apparatus performance coefficient ACOP (S117).

When the central control unit 572 judges that the apparatus performance coefficient ACOP(1) is larger than the apparatus performance coefficient ACOP (YES in S117), the central control unit 572 writes the apparatus performance coefficient ACOP(1) as a new apparatus performance coefficient in the data table 573 (Step S123).

On the other hand, when the central control unit 572 judges that the apparatus performance coefficient ACOP(1) is not larger than the apparatus performance coefficient ACOP (NO in S117), the central control unit 572 inverts the sign of ΔT (see S101) being a change amount of the first coolant temperature T (S118). Thereafter, the central control unit 572 writes the apparatus performance coefficient ACOP(1) as a new apparatus performance coefficient in the data table 573 in a condition that the sign of the above-described ΔT is inverted (Step S123).

In this way, as described using FIG. 4, the central control unit 572 performs processing such as comparison between ACOP and ACOP(1), and then, acquires a target value (apparatus performance coefficient maximum value) at which the apparatus performance coefficient ACOP becomes maximum.

The blower rotational speed control unit 581 sets a rotational speed of the air conditioning blower unit 510 to a blower rotational speed associated with the apparatus performance coefficient maximum value. Further, the coolant temperature control unit 582 controls the freezer 530 so that the first coolant temperature Tin coincides with a temperature associated with the apparatus performance coefficient maximum value.

Thus, the air conditioning blower unit 510 is operated at a blower rotational speed associated with the apparatus performance coefficient maximum value. Further, the freezer 530 flows coolant COO at the first coolant temperature Tin associated with the apparatus performance coefficient maximum value to the second pipe 460 and the fourth pipe 550.

Consequently, the cooling apparatus 1000 is operated at the apparatus performance coefficient maximum value. Specifically, as described above, since a performance coefficient is one of indexes representing energy consumption efficiency, the cooling apparatus 1000 is able to be operated at highest energy consumption efficiency.

As described above, the cooling apparatus 1000 in the first example embodiment of the present invention includes the evaporator 410, the condenser 420, the heat exchanger 520, the freezer 530, the air conditioning blower unit 510 (blower unit), and the control unit 560.

The evaporator 410 receives exhaust heat of the electronic device 300. The condenser 420 releases exhaust heat received by the evaporator 410. The heat exchanger 520 receives exhaust heat of the electronic device 300. The freezer 530 releases exhaust heat received by the heat exchanger 520 and the evaporator 420 by circulating coolant COO between the condenser 420 and the heat exchanger 520. The air conditioning blower unit 510 (blower unit) supplies air for cooling the electronic device 300 to the electronic device 300. The control unit 560 controls operations of the air conditioning blower unit 510 and the freezer 530. Further, the control unit 560 includes the blower power calculation unit 572c, the freezer power calculation unit 572a, the apparatus performance coefficient calculation unit 572b, the blower rotational speed control unit 581 (blower unit rotation control unit), and the coolant temperature control unit 582.

The blower power calculation unit 572c calculates the power consumption Wf of the air conditioning blower unit 510, based on the rotational speed r of the air conditioning blower unit 510. The freezer power calculation unit 572a calculates the power consumption Wc of the freezer 530, based on the heat exchanging amount Q of the electronic device 300, and the performance coefficient COP_c of the freezer 530. The apparatus performance coefficient calculation unit 572b calculates the apparatus performance coefficient ACOP, based on the calorific value Q of the electronic device 300, the power consumption Wc of the freezer 530, and the power consumption Wf of the air conditioning blower unit 510. Note that the apparatus performance coefficient ACOP is a performance coefficient of an apparatus including the evaporator 410, the condenser 420, the heat exchanger 520, the freezer 530, and the blower unit 510.

The blower rotational speed control unit 581 controls the rotational speed r of the air conditioning blower unit 510, based on the apparatus performance coefficient ACOP. The coolant temperature control unit 582 controls the first coolant temperature Tin being a temperature of coolant COO flowing from the freezer 530, based on the apparatus performance coefficient ACOP.

In this way, the power consumption Wf of the air conditioning blower unit 510 is calculated, based on the rotational speed r of the air conditioning blower unit 510 by the blower power calculation unit 572c. The power consumption Wc of the freezer 530 is calculated, based on the heat exchanging amount Q of the electronic device 300 and the performance coefficient COP_c of the freezer 530, by the freezer power calculation unit 572a. Further, the apparatus performance coefficient ACOP is calculated, based on the calorific value Q of the electronic device 300, the power consumption Wc of the freezer 530, and the power consumption Wf of the air conditioning blower unit 510, by the apparatus performance coefficient calculation unit 572b.

Thus, it is possible to easily calculate, from a plurality of easily acquirable parameters, a performance coefficient of an apparatus including the evaporator 410, the condenser 420, the heat exchanger 520, the freezer 530, and the air conditioning blower unit 510, as the apparatus performance coefficient ACOP.

In the present example embodiment, unlike a technique described in PTL 1, a fan for cooling a condenser is not provided. Therefore, any sensor is not disposed in the vicinity of an exhaust side of the fan. Thus, the apparatus performance coefficient ACOP does not greatly vary by wind power of a fan for cooling a condenser.

Further, the apparatus performance coefficient ACOP changes depending on a change in rotational speed (blower rotational speed) of the air conditioning blower unit 510. The blower rotation control unit 581 is able to control a rotational speed (blower rotational speed) of the air conditioning blower unit 510 in such a way that the apparatus performance coefficient ACOP has a high value (e.g. a value close to a maximum value), while satisfying that the supply temperature Ta is equal to or lower than Th. Further, in addition to the above, the coolant temperature control unit 582 controls the freezer 530 in such a way that the first coolant temperature Tin coincides with a temperature associated with the apparatus performance coefficient maximum value, while satisfying that the supply temperature Ta is equal to or lower than Th.

Therefore, according to the cooling apparatus 1000, it is possible to operate a cooling apparatus more stably and with enhanced energy efficiency.

Further, in the cooling apparatus 1000 in the first example embodiment of the present invention, the blower rotation control unit 581 controls the rotational speed r of the air conditioning blower unit 510 in such a way that the apparatus performance coefficient ACOP becomes maximum, while satisfying that the supply temperature Ta is equal to or lower than Th. Further, the coolant temperature control unit 582 controls the first coolant temperature Tin in such a way that the apparatus performance coefficient ACOP becomes maximum, while satisfying that the supply temperature Ta is equal to or lower than Th. Note that the supply temperature Ta is a temperature of air supplied from the air conditioning blower unit 510 of the air conditioner 500 to the electronic device 300. Th is an upper limit threshold value of the supply temperature Ta.

In this way, in the cooling apparatus 1000, the blower rotation control unit 581 controls the rotational speed r of the air conditioning blower unit 510 in such a way that the apparatus performance coefficient ACOP becomes a maximum value, while satisfying that the supply temperature Ta is equal to or lower than Th. Further, the coolant temperature control unit 582 controls the first coolant temperature Tin in such a way that the apparatus performance coefficient ACOP becomes a maximum value, while controlling in such a way as to satisfy that the supply temperature Ta is equal to or lower than Th. Thus, it is possible to operate the cooling apparatus 100 with maximum efficiency.

Further, in the cooling apparatus 1000 in the first example embodiment of the present invention, the blower rotation control unit 581 may control the rotational speed of the air conditioning blower unit 510, after a predetermined time elapses after the apparatus performance coefficient ACOP becomes maximum, while satisfying that the supply temperature Ta is equal to or lower than Th.

In this way, by controlling the rotational speed of the air conditioning blower unit 510 after a predetermined time elapses, it becomes possible to immediately control the rotational speed of the air conditioning blower unit 510 to an optimum rotational speed, even after performance of the local cooler 400 changes by a change in ambient environment within a predetermined time, and a rotational speed of the air conditioning blower unit 510 is no longer an optimum value.

Further, in the cooling apparatus 1000 in the first example embodiment of the present invention, the predetermined time is a time until a temperature in the vicinity of the freezer 530 changes to a value that is determined in advance.

In this way, by setting the predetermined time to a time until a temperature in the vicinity of the freezer 530 changes to a value that is determined in advance, it becomes possible to maximize the apparatus performance coefficient ACOP with respect to all ambient temperatures To by controlling a rotational speed of the air conditioning blower unit 510 and a coolant discharge temperature (first coolant temperature) of the freezer 530 after the predetermined time elapses.

Further, a method for controlling the cooling apparatus 1000 in the first example embodiment of the present invention is a method for controlling the cooling apparatus 1000 including the evaporator 410, the condenser 420, the heat exchanger 520, the freezer 530, the air conditioning blower unit 510 (blower unit), and the control unit 560.

The method for controlling the cooling apparatus 1000 includes a blower power calculating step, a freezer power calculating step, an apparatus performance coefficient calculating step, a blower unit rotation controlling step, and a coolant temperature controlling step.

In the blower power calculating step, the power consumption Wf of the air conditioning blower unit 510 is calculated, based on the rotational speed r of the air conditioning blower unit 510. In the freezer power calculating step, the power consumption Wc of the freezer 530 is calculated, based on the heat exchanging amount Q of the electronic device 300 and the performance coefficient COP_c of the freezer 530. In the apparatus performance coefficient calculating step, the apparatus performance coefficient ACOP is calculated, based on the calorific value Q of the electronic device 300, the power consumption Wc of the freezer 530, and the power consumption Wf of the air conditioning blower unit 510. In the blower unit rotation controlling step, the rotational speed r of the air conditioning blower unit 510 is controlled, based on the apparatus performance coefficient ACOP. In the coolant temperature controlling step, the first coolant temperature Tin being a temperature of coolant COO flowing from the freezer 530 is controlled, based on the apparatus performance coefficient ACOP.

Also by the above-described control method, a similar advantageous effect as in the cooling apparatus 1000 can be provided.

Further, a control program of the cooling apparatus 1000 in the first example embodiment of the present invention is a control program of the cooling apparatus 1000 including the evaporator 410, the condenser 420, the heat exchanger 520, the freezer 530, the air conditioning blower unit 510 (blower unit), and the control unit 560.

The control program of the cooling apparatus 1000 causes a computer to execute processing including the blower power calculating step, the freezer power calculating step, the apparatus performance coefficient calculating step, the blower unit rotation controlling step, and the coolant temperature controlling step.

Also by the above-described control program, a similar advantageous effect as in the cooling apparatus 1000 can be provided.

Second Example Embodiment

Figure 8:
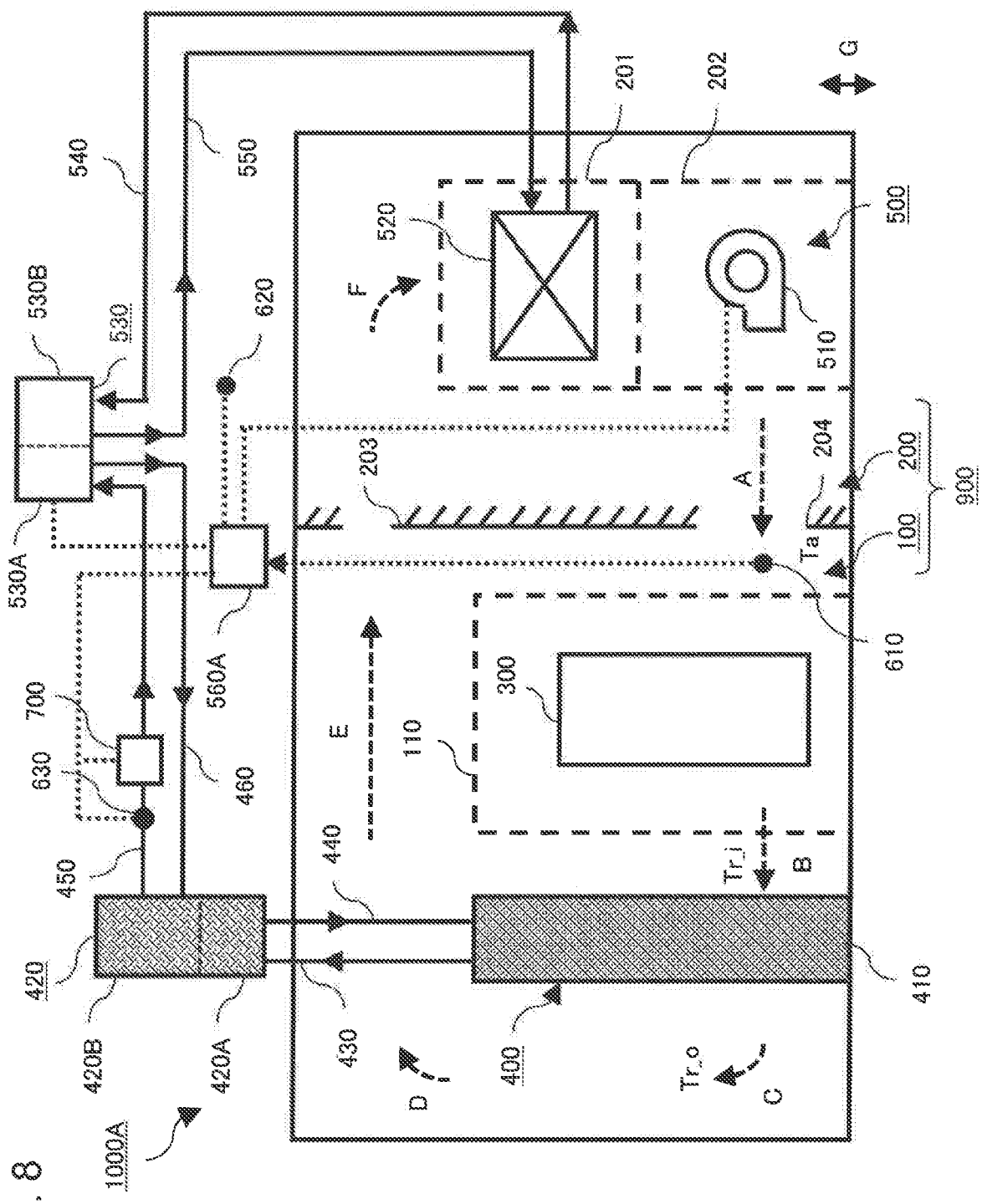
FIG. 8 is a transparent view illustrating a configuration of a cooling apparatus in a second example embodiment of the present invention.

A configuration of a cooling apparatus 1000A in a second example embodiment of the present invention is described. FIG. 8 is a transparent diagram illustrating a configuration of the cooling apparatus 1000A. Note that FIG. 8 illustrates a vertical direction G. Note that, in FIG. 8, constituent elements equivalent to respective constituent elements illustrated in FIG. 1 to FIG. 7 are indicated with the same reference numbers as reference numbers illustrated in FIG. 1 to FIG. 7. The cooling apparatus 1000A is installed in a data center, for example.

As illustrated in FIG. 8, the cooling apparatus 1000A includes a local cooler 400 and an air conditioner 500. An evaporator 410 of the local cooler 400, and an electronic device 300 are provided within a server room 100. An air conditioning blower unit 510 and a heat exchanger 520 of the air conditioner 500 are provided within a machine room 200. Note that an inside of a housing 900 constituted by connecting the server room 100 and the machine room 200 is sealed.

Herein, comparison is made between FIG. 1 and FIG. 8. FIG. 8 is different from FIG. 1 in a point that a third temperature detection unit 630 and a flow rate detection unit 700 are provided.

As illustrated in FIG. 8, the third temperature detection unit 630 is connected to a control unit 560A. The third temperature detection unit 630 detects a second coolant temperature Tout being a temperature of coolant COO flowing through a first pipe 450 from a condenser 420 (second condenser 420B) toward a freezer 530.

As illustrated in FIG. 8, the flow rate detection unit 700 is connected to the control unit 560A. The flow rate detection unit 700 detects a coolant flow rate Qw being a flow rate of coolant COO flowing through the first pipe 450 from the condenser 420 (second condenser 420B) toward the freezer 530.

The control unit 560A is connected to the air conditioning blower unit 510, the freezer 530, a first temperature detection unit 610, a second temperature detection unit 620, the third temperature detection unit 630, and the flow rate detection unit 700.

The control unit 560A acquires a supply temperature Ta from the first temperature detection unit 610. The control unit 560A acquires an ambient temperature To from the second temperature detection unit 620. The control unit 560A acquires the second coolant temperature Tout from the third temperature detection unit 630. Further, the control unit 560A acquires the coolant flow rate Qw from the flow rate detection unit 700.

Figure 9:
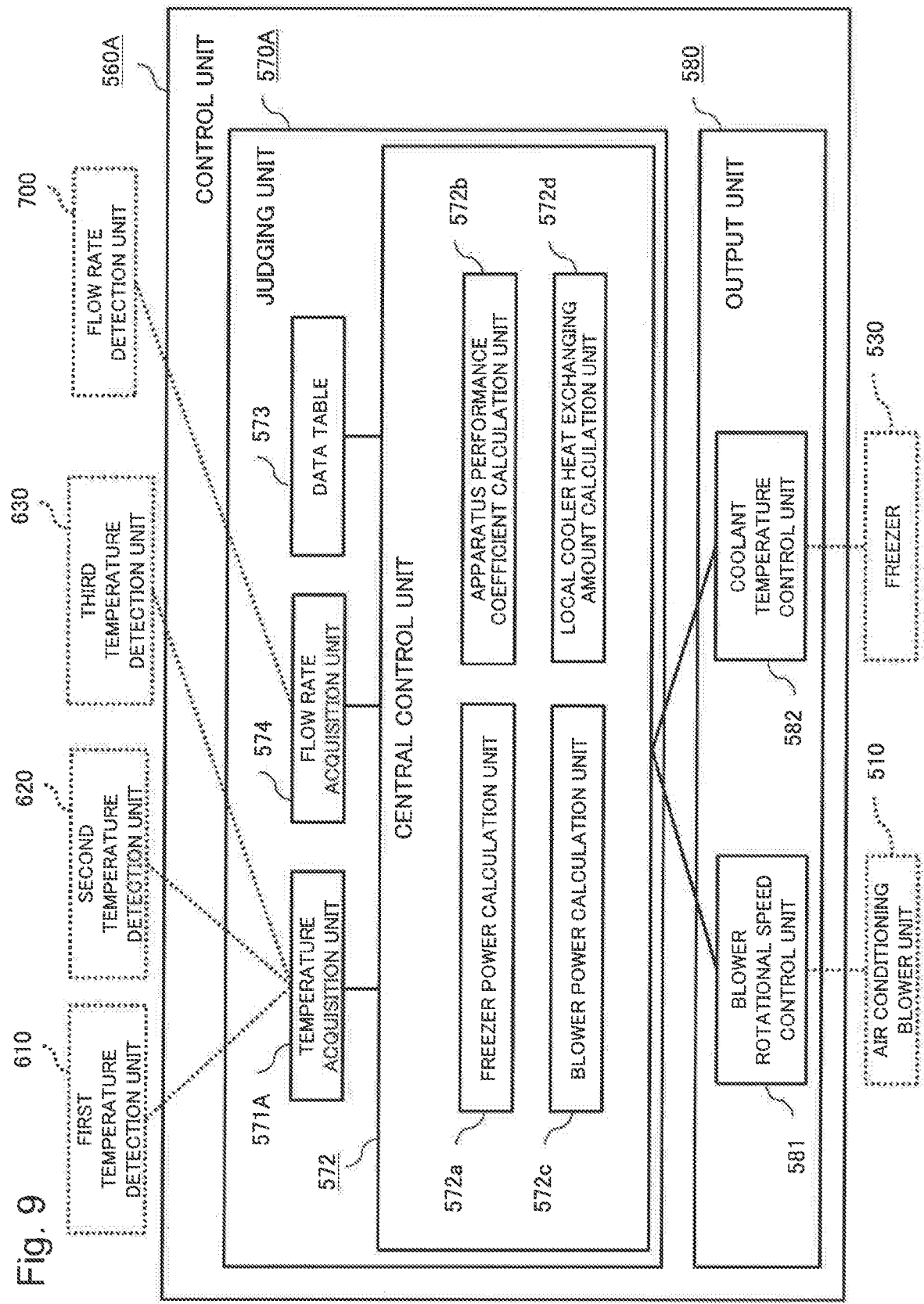
FIG. 9 is a block diagram illustrating a configuration of a control unit.

Next, a configuration of the control unit 560A is described in detail. FIG. 9 is a block diagram illustrating a configuration of the control unit 560A. Note that, in FIG. 9, constituent elements equivalent to respective constituent elements illustrated in FIG. 1 to FIG. 8 are indicated with the same reference numbers as reference numbers illustrated in FIG. 1 to FIG. 8.

As illustrated in FIG. 9, the control unit 560A includes a judging unit 570A and an output unit 580.

As illustrated in FIG. 9, the judging unit 570A includes a temperature acquisition unit 571A, a central control unit 572A, a data table 573, and a flow rate acquisition unit 574.

Herein, comparison is made between FIG. 3 and FIG. 9. In FIG. 3, the temperature acquisition unit 571 is connected to the first temperature detection unit 610, the second temperature detection unit 620, and the central control unit 572. On the other hand, in FIG. 9, the temperature acquisition unit 571A is connected to the first temperature detection unit 610, the second temperature detection unit 620, the third temperature detection unit 630, and the central control unit 572. In this point, FIG. 3 and FIG. 9 are different.

Further, FIG. 9 is different from FIG. 3 in a point that the flow rate detection unit 700, the flow rate acquisition unit 574, and a local cooler heat exchanging amount calculation unit 572d are provided.

The temperature acquisition unit 571A acquires the supply temperature Ta detected by the first temperature detection unit 610, the ambient temperature To detected by the second temperature detection unit 620, and the second coolant temperature Tout detected by the third temperature acquisition unit 630. Further, the temperature acquisition unit 571A outputs the supply temperature Ta, the ambient temperature To, and the second coolant temperature Tout to the central control unit 572.

The flow rate acquisition unit 574 acquires the coolant flow rate Qw detected by the flow rate detection unit 700. The flow rate acquisition unit 574 outputs the coolant flow rate Qw to the central control unit 572.

The local cooler heat exchanging amount calculation unit 572d calculates a heat exchanging amount Qr of the local cooler 400, based on the coolant flow rate Qw, a first coolant temperature Tin, and the second coolant temperature Tout. Note that a heat exchanging amount of the local cooler 400 is also referred to as an endothermic amount of the local cooler 400. A specific function of the local cooler heat exchanging amount calculation unit 572d is described in detail in the following operation description.

A configuration other than the above is similar to description in the first example embodiment.

In the foregoing, a configuration of the cooling apparatus 1000A in the second example embodiment is described.

Figure 10:
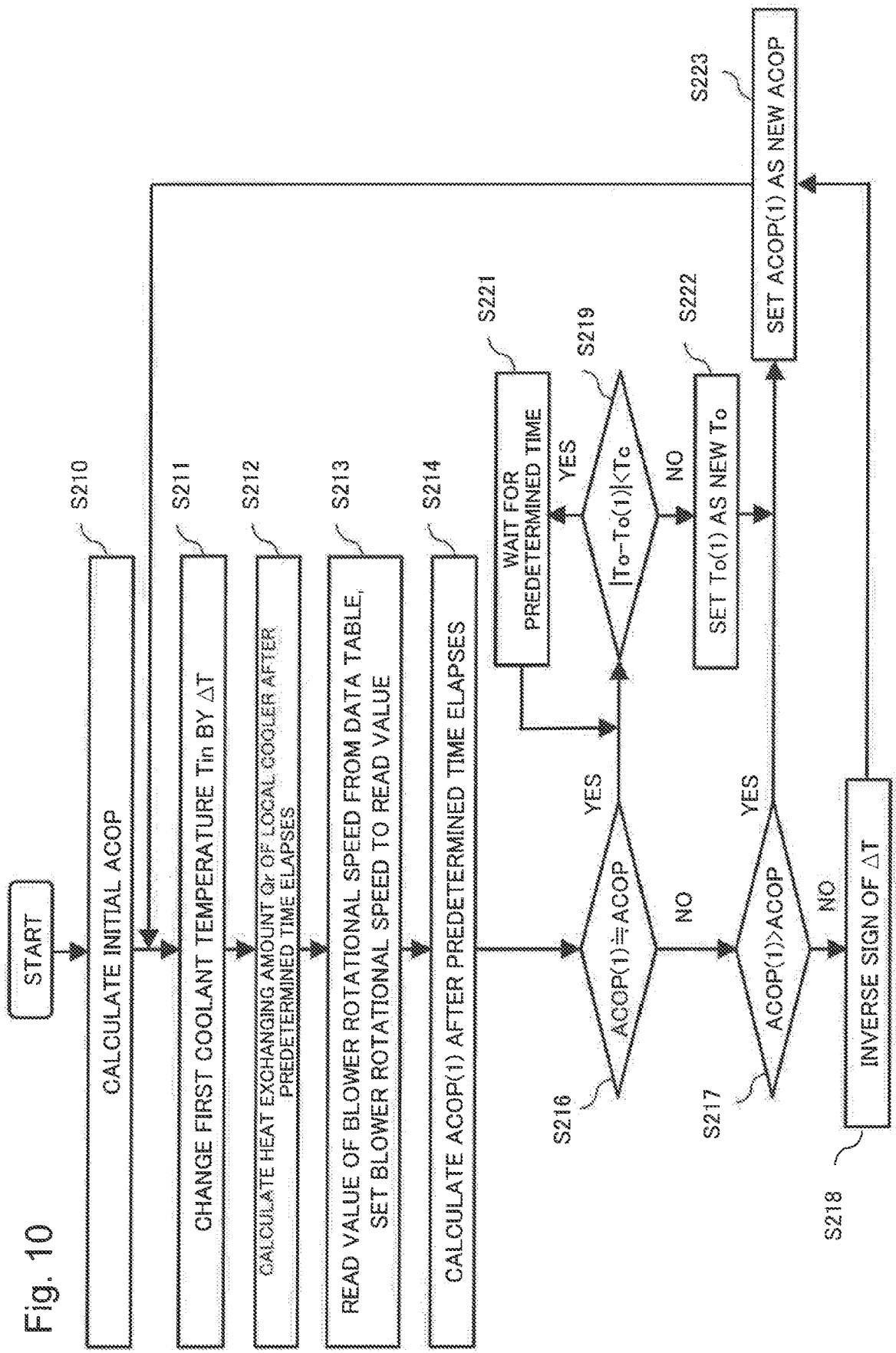
FIG. 10 is a control flow diagram of the cooling apparatus in the second example embodiment of the present invention.

Next, a control method of the cooling apparatus 1000A is described. FIG. 10 is a control flow diagram of the cooling apparatus 1000A.

As illustrated in FIG. 10, first of all, an apparatus performance coefficient calculation unit 572b of the control unit 560A calculates an initial ACOP (S210). The processing of S210 is similar to processing of S100 in FIG. 4 and FIG. 5.

Next, the cooling apparatus 1000 raises the first coolant temperature (coolant discharge temperature) Tin by ΔT (S211). Specifically, the central control unit 572 outputs an instruction to a coolant temperature control unit 582 so as to change the first coolant temperature Tin by +ΔT. The coolant temperature control unit 582 changes the first coolant temperature Tin by +ΔT in accordance with the instruction of the central control unit 572.

Next, the cooling apparatus 1000 calculates the heat exchanging amount Qr of the local cooler 400 after a predetermined time (e.g. about one minute) elapses (S212). Specifically, the central control unit 572 outputs an instruction to the local cooler heat exchanging amount calculation unit 572d so as to calculate the heat exchanging amount Qr of the local cooler 400. The local cooler heat exchanging amount calculation unit 572d calculates the heat exchanging amount Qr of the local cooler 400 by using Eq. (7) in accordance with the instruction of the central control unit 572. Note that ρ in Eq. (7) is a density. Cp in Eq. (7) is a specific heat at constant pressure.

$$Qr = \rho \times Cp \times Qw \times (Tout - Tin) \quad \text{Eq. (7)}$$

Next, the cooling apparatus 1000 reads, from the data table 573, a rotational speed (blower rotational speed) of the air conditioning blower unit 510, and sets the blower rotational speed to the read value (S213). Specifically, the central control unit 570A reads, from the data table 573, a rotational speed (blower rotational speed) of the air conditioning blower unit 510. At this occasion, a rotational speed of the air conditioning blower unit 510 is stored in advance in the data table 573 in association with a heat exchanging amount Qc of the air conditioner 500.

Note that a relationship among the heat exchanging amount Qr of the local cooler 400, the heat exchanging amount Qc of the air conditioner 500, and a heat exchanging amount Q of the electronic device 300 is as expressed by Eq. (8).

$$Qc = Q - Qr \quad \text{Eq. (8)}$$

Therefore, first of all, the central control unit 570A calculates the heat exchanging amount Qc of the air conditioner 500 from the heat exchanging amount Qr of the local cooler 400 calculated in S212, by using Eq. (8). Further, the central control unit 570A reads, from the data table 573, a blower rotational speed (rotational speed of the air conditioning blower unit 510) associated with the calculated value of the heat exchanging amount Qc of the air conditioner 500.

Next, the cooling apparatus 1000 calculates an apparatus performance coefficient ACOP(1) similarly to S106 in FIG. 4, after a predetermined time (e.g. about one minute) elapses (S214).

Specifically, first of all, a blower power calculation unit 572c calculates power consumption Wf1 of the air conditioning blower unit 510, based on a rotational speed r1 of the air conditioning blower unit 510 set in S213.

Herein, first of all, the central control unit 572 acquires the rotational speed r1 of the air conditioning blower unit 510 from a blower rotational speed control unit 581.

Thereafter, the blower power calculation unit 572c of the central control unit 572 calculates the power consumption Wf1 of the air conditioning blower unit 510, after waiting for a predetermined time (e.g. about one minute) until cooling performance is stabilized.

A calculation formula of the power consumption Wf1 of the air conditioning blower unit 510 is expressed as Eq. (9) by using a rated power value Wf_max of the air conditioning blower unit 510, the rotational speed r1 of the air conditioning blower unit 510, and a maximum rotational speed r_max of the air conditioning blower unit 510. Wf1 corresponds to Wf when a rotational speed (blower rotational speed) of the air conditioning blower unit 510 is set to r1. Eq. (9) is in conformity with Eq. (4).

$$Wf1 = Wf\_max \times (r1/r\_max)^3 \quad \text{Eq. (9)}$$

Further, regarding the power consumption Wf1 of the air conditioning blower unit 510, a value calculated in advance by an experiment may be stored in the data table 573. In this case, the blower power calculation unit 572c may also acquire the power consumption Wf1 of the air conditioning blower unit 510 stored in the data table 573, in place of calculating the power consumption Wf1 of the air conditioning blower unit 510 by using Eq. (9).

Next, a freezer power calculation unit 572a calculates power consumption Wc of the freezer 530 by using Eq. (10), based on the heat exchanging amount Q of the electronic device 300 and an apparatus coefficient COP_c1 of the freezer 530. At this occasion, the apparatus coefficient COP_c1 of the freezer 530 corresponds to COP_c when a rotational speed of the air conditioning blower unit 510 is set to r1. The central control unit 572 acquires the performance coefficient COP_c1 of the freezer 530 from the data table 573. Note that the calorific value Q of the electronic device 300 is a constant value. The calorific value Q of the electronic device 300 is known in advance from a catalog and the like, and is stored in advance in the data table 573, for example. Wc1 corresponds to Wc when a rotational speed of the air conditioning blower unit 510 is set to r1. Eq. (10) is in conformity with Eq. (5).

$$Wc1 = Q/COP\_c1 \quad \text{Eq. (10)}$$

Further, the apparatus performance coefficient calculation unit 572b calculates the apparatus performance coefficient ACOP(1) by using Eq. (11), based on the calorific value Q of the electronic device 300, the power consumption Wc1 of the freezer 530, and the power consumption Wf1 of the air conditioning blower unit 510. As Wf1 and Wc1 in Eq. (11), values calculated by Eq. (9) and Eq. (10) are employed. As described above, the calorific value Q of the electronic device 300 is a constant value. The calorific value Q of the electronic device 300 is known in advance from a catalog and the like, and is stored in advance in the data table 573, for example. Eq. (11) is in conformity with Eq. (6).

$$ACOP(1)=Q/(Wf1+Wc1) \qquad \text{Eq. (11)}$$

As described above, the cooling apparatus 1000 calculates the apparatus performance coefficient ACOP(1) in S214.

S216 to S223 being processing thereafter correspond to S116 to S123 in FIG. 4.

In the foregoing, a control method of the cooling apparatus 1000A is described.

Figure 11:
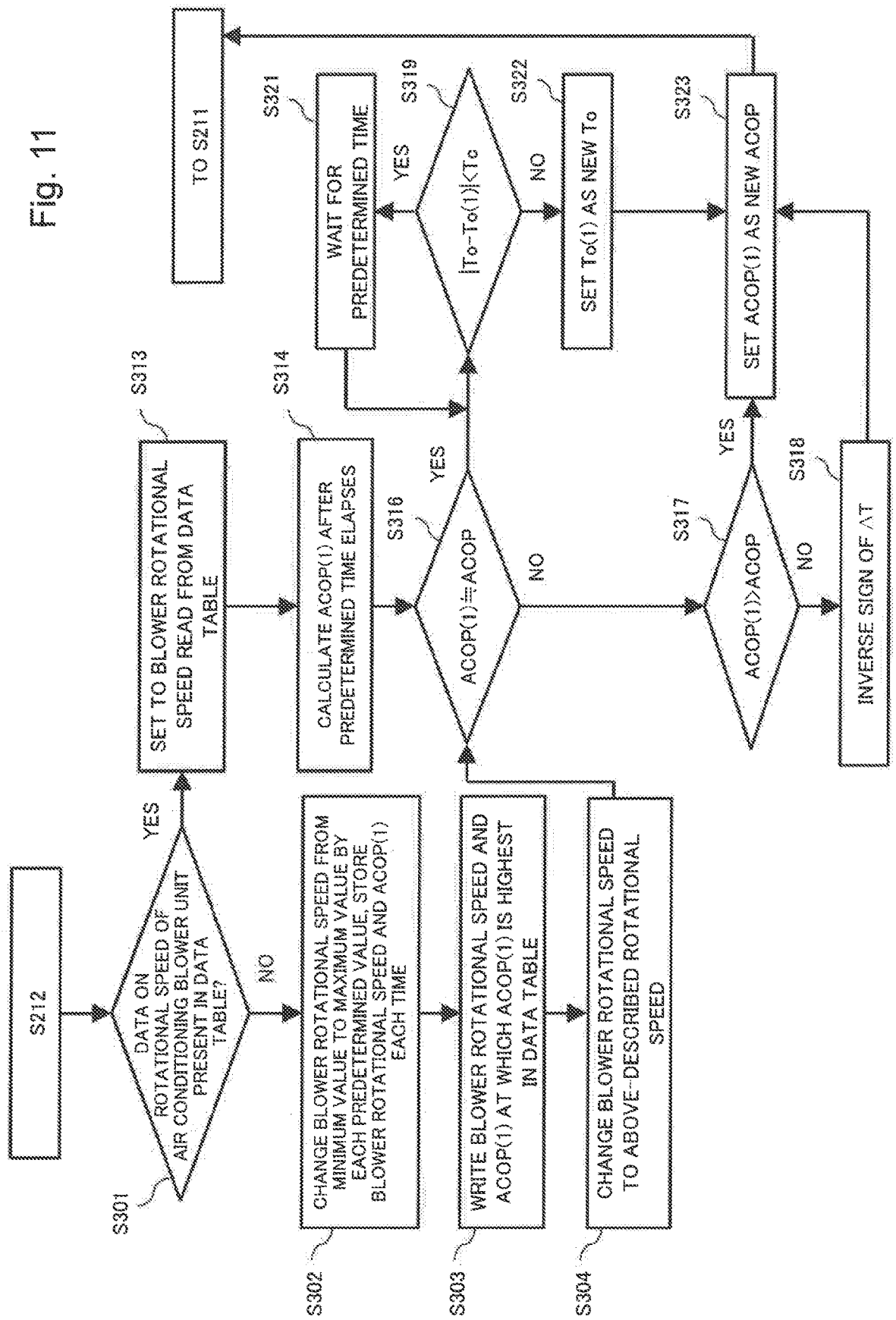
FIG. 11 is a control flow diagram of a modification example of the cooling apparatus in the second example embodiment of the present invention.

Next, a modification example of the cooling apparatus 1000A in the second example embodiment is described using a drawing. FIG. 11 is a control flow diagram of a modification example of the cooling apparatus 1000A, and particularly illustrates a modification example in which processing before and after S213 and S214 in FIG. 10 is changed.

In S213 in FIG. 10, there is a premise that a rotational speed of the air conditioning blower unit 510 is stored in advance in the data table 573 in association with the heat exchanging amount Qc of the air conditioner 500. Further, in S213 in FIG. 10, specifically, the central control unit 570 reads a rotational speed (blower rotational speed) of the air conditioning blower unit 510 from the data table 573, and sets the blower rotational speed to the read value.

On the other hand, in processing in FIG. 11, the cooling apparatus 1000A stores a rotational speed of the air conditioning blower unit 510 and the heat exchanging amount Qc of the air conditioner 500 in the data table 573 in association with each other, while performing processing associated with S213.

As illustrated in FIG. 11, after processing of S212 in FIG. 10, first of all, the central control unit 572A confirms whether or not data on the rotational speed r of the air conditioning blower unit 510 for each heat exchanging amount Qc of the air conditioner 500 are stored in the data table 573 (S301). Specifically, the central control unit 572A confirms that data on the rotational speed r of the air conditioning blower unit 510 measured for each heat exchanging amount Qc of the air conditioner 500 are stored in the data table 573.

When the central control unit 572A judges that data on the rotational speed r of the air conditioning blower unit 510 for each heat exchanging amount Qc of the air conditioner 500 are stored in the data table 573 (YES in S301), the central control unit 572A reads, from the data table 573, a value of a blower rotational speed (rotational speed of the air conditioning blower unit 510), and causes the blower rotational speed control unit 581 to set the blower rotational speed to the read rotational speed (S313). The blower rotational speed control unit 581 controls the blower rotational speed in accordance with control of the central control unit 572A. Note that S313 is processing similar to S213 in FIG. 10.

On the other hand, when the central control unit 572A judges that data on the rotational speed r of the air conditioning blower unit 510 for each heat exchanging amount Qc of the air conditioner 500 are not stored in the data table 573 (NO in S301), the central control unit 572A causes the blower rotational speed control unit 581 to perform control of changing the blower rotational speed from a minimum value to a maximum value by each predetermined value (S302). Further, the blower rotational speed control unit 581 controls the blower rotational speed in accordance with control of the central control unit 572A. The central control unit 572A acquires a blower rotational speed and ACOP(1), after a predetermined time (e.g. one minute) elapses, at each time the blower rotational speed is controlled; and stores the acquired blower rotational speed and ACOP(1) in the data table 573 (S302).

Next, the central control unit 572A writes a blower rotational speed at which ACOP(1) is highest, and ACOP(1) in the data table 573 (S303).

Next, the blower rotational speed control unit changes the blower rotational speed to the blower rotational speed written in S302 in accordance with control of the central control unit 572A (S304).

After processing of S313, the apparatus performance coefficient calculation unit 572b of the central control unit 572A calculates ACOP(1), after a predetermined time (e.g. one minute) elapses (S304). Note that S313 is processing similar to S214 in FIG. 10.

Next, the central control unit 572A judges whether or not the apparatus performance coefficient ACOP(1) and the apparatus performance coefficient ACOP have substantially same values (S316). Processing of S316 is processing similar to S216 in FIG. 10.

When the central control unit 572A judges that the apparatus performance coefficient ACOP(1) and the apparatus performance coefficient ACOP have substantially same values (YES in S316), the central control unit 572A judges whether or not an absolute value of a difference value between an ambient temperature To(1) and the ambient temperature To is smaller than a threshold value Tc ($|To-To(1)|<Tc$) (S319). Processing of S319 is processing similar to S219 in FIG. 10. Processing of S316 is also performed after processing of S304.

When the central control unit 572A judges that an absolute value of a difference value between the ambient temperature To(1) and the ambient temperature To is smaller than the threshold value Tc (YES in S319), the central control unit 572A waits for a predetermined time (e.g. ten minutes) (S321), and repeatedly performs processing of S319. Processing of S321 is processing similar to S221 in FIG. 10.

On the other hand, when the central control unit 572A judges that an absolute value of a difference value between the ambient temperature To(1) and the ambient temperature To is not smaller than the threshold value Tc (NO in S319), the central control unit 572A writes the ambient temperature To(1) as a new ambient temperature in the data table 573 (S322). Thereafter, the central control unit 572 writes the apparatus performance coefficient ACOP(1) as a new apparatus performance coefficient in the data table 573 (Step S323). Further, the cooling apparatus 1000 performs processing of S211 in FIG. 10. Note that processing of S322 and S323 is processing similar to S222 and S223 in FIG. 10.

When the central control unit 572a judges that the apparatus performance coefficient ACOP(1) and the apparatus performance coefficient ACOP do not have substantially same values (NO in S316), the central control unit 572A judges whether or not the apparatus performance coefficient ACOP(1) is larger than the apparatus performance coefficient ACOP (S317). Processing of S317 is processing similar to S217 in FIG. 10.

When the central control unit 572A judges that the apparatus performance coefficient ACOP(1) is larger than the apparatus performance coefficient ACOP (YES in S317), the central control unit 572A performs processing of S323.

On the other hand, when the central control unit 572A judges that the apparatus performance coefficient ACOP(1) is not larger than the apparatus performance coefficient ACOP (NO in S317), the central control unit 572A inverts the sign of $\Delta T$ (see S211) being a change amount of a coolant discharge temperature of the freezer 530 (S318). Note that processing of S318 is processing similar to S218 in FIG. 10. Thereafter, the central control unit 572A performs processing of S323. Further, the cooling apparatus 1000 performs processing of S211 in FIG. 10.

The cooling apparatus 1000A in the second example embodiment of the present invention further includes the local cooler heat exchanging amount calculation unit 572d. The local cooler heat exchanging amount calculation unit 572d calculates the heat exchanging amount Qr of a local cooler, based on the first coolant temperature (coolant discharge temperature) Tin, the second coolant temperature Tout, and the coolant flow rate Qw. The second coolant temperature Tout is a temperature of coolant COO flowing from the condenser 420 toward the freezer 530 through the first pipe 450. The first pipe 450 carries coolant COO from the condenser 420 to the freezer 530. The coolant flow rare Qw is a flow rate of coolant COO flowing through the first pipe 450. The freezer power calculation unit 572a calculates the power consumption Wc of the freezer 530, based on the heat exchanging amount Qr of the local cooler, the heat exchanging amount Qc of the air conditioner, and a performance coefficient of the freezer.

Thus, as compared with a configuration of the first example embodiment, convergence of control toward an optimum value at which ACOP becomes maximum is made fast, since a rotational speed of the air conditioning blower unit 510 is determined from a data table, based on the endothermic amount Qr of the local cooler 400, in place of determining a rotational speed of the air condition blower unit 510 step by step.

Third Example Embodiment

Figure 12:
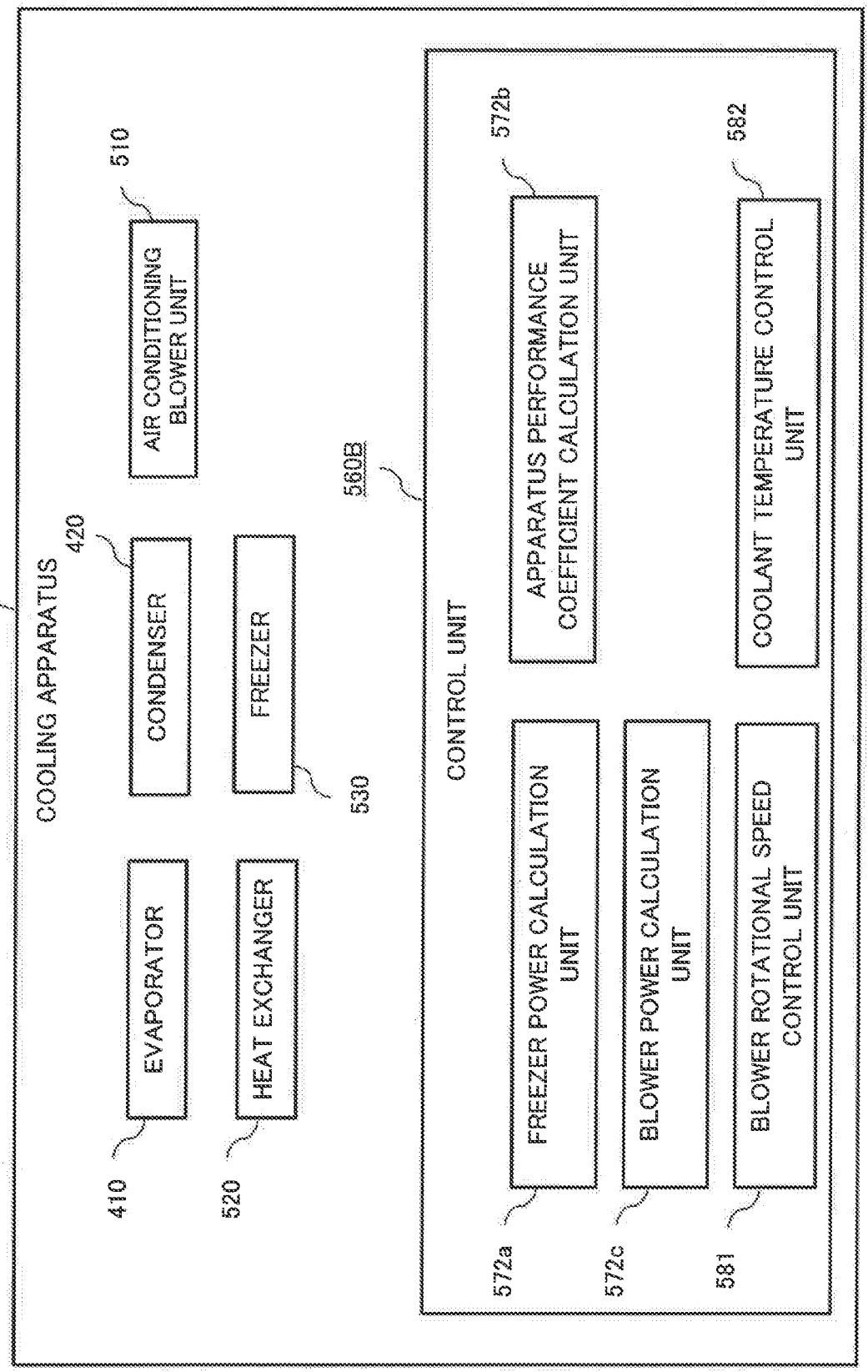
FIG. 12 is a transparent view illustrating a configuration of a cooling apparatus in a third example embodiment of the present invention.

A configuration of a cooling apparatus 1000B in a third example embodiment is described. FIG. 12 is a diagram illustrating a configuration of the cooling apparatus 1000B. In FIG. 12, constituent elements equivalent to respective constituent elements illustrated in FIG. 1 to FIG. 11 are indicated with the same reference numbers as reference numbers illustrated in FIG. 1 to FIG. 11. The cooling apparatus 1000B is installed in a data center, for example.

The cooling apparatus 1000B in the third example embodiment of the present invention includes an evaporator 410, a condenser 420, a heat exchanger 520, a freezer 530, an air conditioning blower unit 510 (blower unit), and a control unit 560B.

The evaporator 410 receives exhaust heat of an electronic device 300. The condenser 420 releases exhaust heat received by the evaporator 410. The heat exchanger 520 receives exhaust heat of the electronic device 300. The freezer 530 releases exhaust heat received by the heat exchanger 520 and the evaporator 420 by circulating coolant COO between the condenser 420 and the heat exchanger 520. The air conditioning blower unit 510 (blower unit) supplies air for cooling the electronic device 300 to the electronic device 300. The control unit 560B controls operations of the air conditioning blower unit 510 and the freezer 530. Further, the control unit 560B includes a blower power calculation unit 572c, a freezer power calculation unit 572a, an apparatus performance coefficient calculation unit 572b, a blower rotational speed control unit 581 (blower unit rotation control unit), and a coolant temperature control unit 582.

The blower power calculation unit 572c calculates power consumption Wf of the air conditioning blower unit 510, based on a rotational speed r of the air conditioning blower unit 510. The freezer power calculation unit 572a calculates power consumption Wc of the freezer 530, based on a heat exchanging amount Q of the electronic device 300, and a performance coefficient COP_c of the freezer 530. The apparatus performance coefficient calculation unit 572b calculates an apparatus performance coefficient ACOP, based on the calorific value Q of the electronic device 300, the power consumption Wc of the freezer 530, and the power consumption Wf of the air conditioning blower unit 510. Note that the apparatus performance coefficient ACOP is a performance coefficient of an apparatus including the evaporator 410, the condenser 420, the heat exchanger 520, the freezer 530, and the blower unit 510.

The blower rotational speed control unit 581 controls the rotational speed r of the air conditioning blower unit 510, based on the apparatus performance coefficient ACOP. The coolant temperature control unit 582 controls a first coolant temperature Tin being a temperature of coolant COO flowing from the freezer 530, based on the apparatus performance coefficient ACOP.

All respective constituent elements in the present example embodiment play the same function as the cooling apparatus 1000 in the first example embodiment.

Therefore, the cooling apparatus 1000B in the present example embodiment provides a similar advantageous effect as the cooling apparatus 1000 in the first example embodiment.

Specifically, the power consumption Wf of the air conditioning blower unit 510 is calculated, based on the rotational speed r of the air conditioning blower unit 510 by the blower power calculation unit 572c. The power consumption Wc of the freezer 530 is calculated, based on the heat exchanging amount Q of the electronic device 300 and the performance coefficient COP_c of the freezer 530 by the apparatus performance coefficient calculation unit 572b. Further, the apparatus performance coefficient ACOP is calculated, based on the calorific value Q of the electronic device 300, the power consumption Wc of the freezer 530, and the power consumption Wf of the air conditioning blower unit 510 by the apparatus performance coefficient calculation unit 572b.

Thus, it is possible to easily calculate a performance coefficient of an apparatus including the evaporator 410, the condenser 420, the heat exchanger 520, the freezer 530, and the blower unit 510, as the apparatus performance coefficient ACOP from a plurality of easily acquirable parameters.

In the invention of the present application, unlike a technique described in PTL 1, a fan for cooling a condenser is not provided. Therefore, any sensor is not disposed in the vicinity of an exhaust side of the fan. Thus, the apparatus performance coefficient ACOP does not greatly vary by wind power of a fan for cooling a condenser.

Further, the apparatus performance coefficient ACOP changes depending on a change in rotational speed (blower rotational speed) of the air conditioning blower unit 510. The blower rotation control unit 581 is able to control a rotational speed (blower rotational speed) of the air conditioning blower unit 510 in such a way that the apparatus performance coefficient ACOP has a high value (e.g. a value close to a maximum value), while satisfying that a supply temperature Ta is equal to or lower than Th. Further, in addition to the above, the coolant temperature control unit 582 controls the freezer 530 in such a way that the first coolant temperature Tin coincides with a temperature associated with an apparatus performance coefficient maximum value, while satisfying that the supply temperature Ta is equal to or lower than Th.

Therefore, according to the cooling apparatus 1000, it is possible to operate a cooling apparatus more stably and with enhanced energy efficiency.

Figure 13:
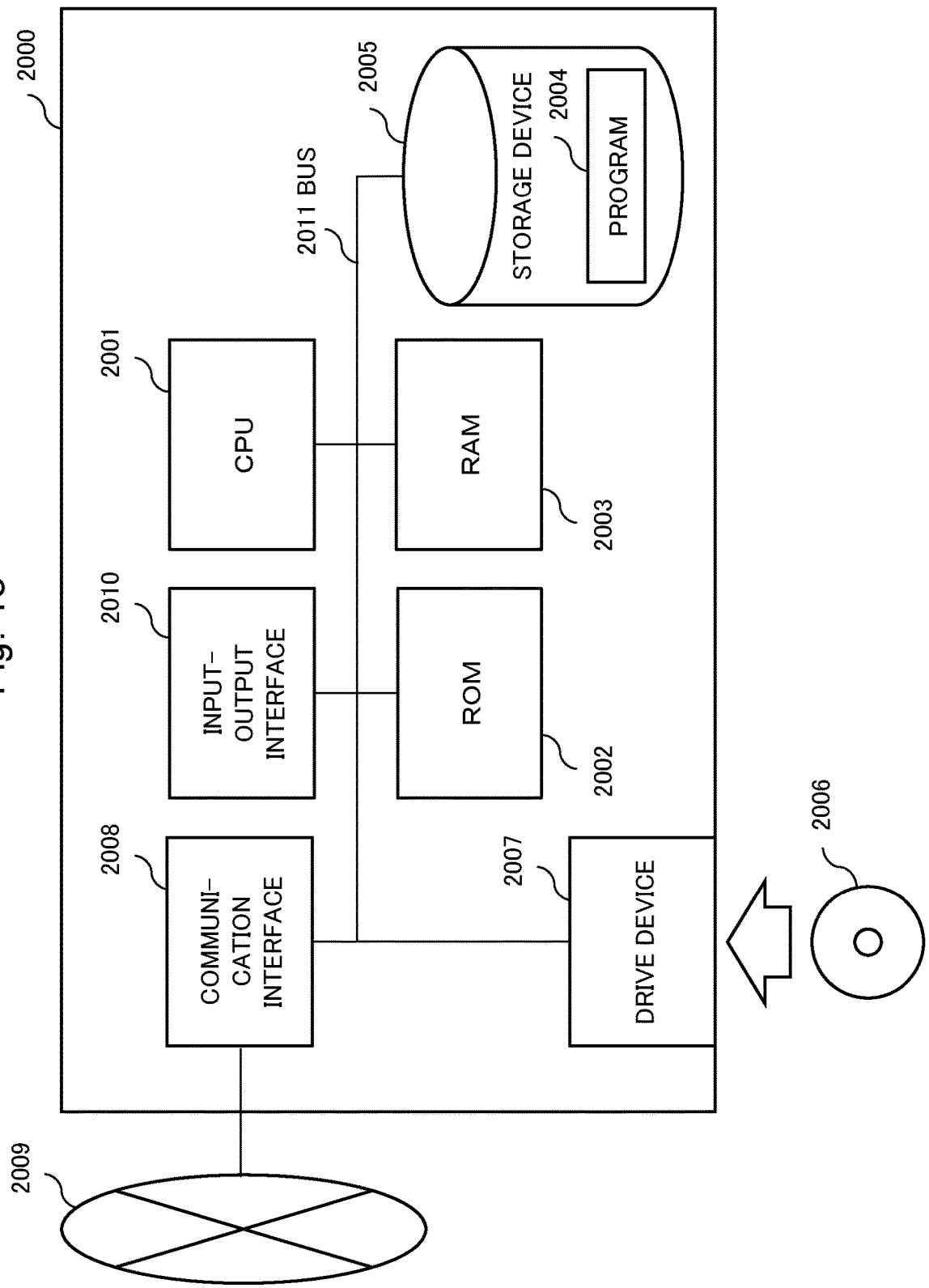
FIG. 13 is a diagram illustrating an example of an information processing device.

Note that, a part or the entirety of respective constituent elements of respective apparatuses or systems is implemented by any combination of an information processing device 2000 and a program as illustrated in FIG. 13, for example. FIG. 13 is a diagram illustrating an example of an information processing device that implements the control units 560, 560A, 560B, and the like.

The information processing device 2000 includes the following configuration, as an example.

A central processing unit (CPU) 2001,
a read only memory (ROM) 2002,
a random access memory (RAM) 2003,
a program 2004 to be loaded in the RAM 2003,
a storage device 2005 for storing the program 2004,
a drive device 2007 for reading and writing with respect to a recording medium 2006,
a communication interface 2008 to be connected to a communication network 2009,
an input-output interface 2010 for performing input and output of data, and
a bus 2011 for connecting the respective constituent elements.

Respective constituent elements of respective apparatuses in respective example embodiments are implemented by causing the CPU 2001 to acquire and execute the program 2004 that implements these functions. The program 2004 that implements functions of respective constituent elements of respective apparatuses is, for example, stored in advance in the storage device 2005 or the RAM 2003. The CPU 2001 reads the program 2004 as necessary. Note that the program 2004 may be supplied to the CPU 2001 via the communication network 2009; or may be stored in advance in the recording medium 2006, and the drive device 2007 may read the program and supply the program to the CPU 2001.

Various modification examples are available as a method for implementing respective apparatuses. For example, respective apparatuses may be implemented by any combination of an individual information processing device 2000 and a program for each constituent element. Further, a plurality of constituent elements provided in respective apparatuses may be implemented by any combination of one information processing device 2000 and a program.

Further, a part or the entirety of respective constituent elements of respective apparatuses is implemented by a general purpose or dedicated circuitry including a processor and the like, or combination of these elements. These elements may be constituted of a single chip, or may be constituted of a plurality of chips connected via a bus. A part or the entirety of respective constituent elements of respective apparatuses may be implemented by a combination of the above-described circuitry and the like and a program.

When a part or the entirety of respective constituent elements of respective apparatuses is implemented by a plurality of information processing devices, circuitries, and the like, the plurality of information processing devices, circuitries, and the like may be collectively or distributively disposed. For example, an information processing device, a circuitry, and the like may be implemented as a configuration in which respective components are connected via a communication network, such as a client-and-server system or a cloud computing system.

Further, a part or the entirety of the above-described example embodiments may be described as the following supplementary notes, but are not limited to the following.

[Supplementary Note 1]

A cooling apparatus including:
an evaporator for receiving exhaust heat of an electronic device;
a condenser for releasing the exhaust heat received by the evaporator;
a heat exchanger for receiving exhaust heat of the electronic device;
a freezer for releasing exhaust heat received by the heat exchanger and the evaporator by circulating coolant between the condenser and the heat exchanger;
a blower unit for supplying air for cooling the electronic device to the electronic device; and
a control unit for controlling operations of the blower unit and the freezer, wherein
the controller unit includes:
a blower power calculation unit for calculating power consumption of a blower unit, based on a rotational speed of a blower unit;
a freezer power calculation unit for calculating power consumption of the freezer, based on a heat exchanging amount of the electronic device, and a performance coefficient of the freezer;
an apparatus performance coefficient calculation unit for calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;
a blower unit rotation control unit for controlling a rotational speed of the blower unit, based on the apparatus performance coefficient; and
a coolant temperature control unit for controlling a first coolant temperature being a temperature of the coolant flowing from the freezer, based on the apparatus performance coefficient.

[Supplementary Note 2]

The cooling apparatus according to supplementary note 1, further including
a local cooler heat exchanging amount calculation unit for acquiring a heat exchanging amount of the local cooler, based on the first coolant temperature, a second coolant temperature being a temperature of the coolant flowing through a first pipe that carries the coolant from the condenser to the freezer, and a coolant flow rate being a flow rate of coolant flowing through the first pipe, wherein
the freezer power calculation unit calculates consumption power of the freezer, based on a heat exchanging amount of the local cooler, a heat exchanging amount of the air conditioner, and a performance coefficient of the freezer.

[Supplementary Note 3]

The cooling apparatus according to supplementary note 1 or 2, wherein
the blower unit rotation control unit controls a rotational speed of the blower unit in such a way that the apparatus performance coefficient becomes maximum, while satisfying that a supply temperature being a temperature of air supplied from the blower unit to the electronic device is equal to or lower than an upper limit threshold value of the supply temperature, and
the coolant temperature control unit controls the first coolant temperature in such a way that the apparatus performance coefficient becomes maximum, while satisfying that the supply temperature is equal to or lower than an upper limit threshold value of the supply temperature.

[Supplementary Note 4]

The cooling apparatus according to supplementary note 1 or 2, wherein the blower unit rotation control unit controls a rotational speed of the blower unit, after a predetermined time elapses after the apparatus performance coefficient becomes maximum, while satisfying that a supply temperature being a temperature of air supplied from the blower unit to the electronic device is equal to or lower than an upper limit threshold value of the supply temperature.

[Supplementary Note 5]

The cooling apparatus according to supplementary note 4, wherein the predetermined time is a time until a temperature in a vicinity of the freezer changes to a value that is determined in advance.

[Supplementary Note 6]

A control method of a cooling apparatus including:

an evaporator for receiving exhaust heat of an electronic device;

a condenser for releasing the exhaust heat received by the evaporator;

a heat exchanger for receiving exhaust heat of the electronic device;

a freezer for releasing exhaust heat received by the heat exchanger and the evaporator by circulating coolant between the condenser and the heat exchanger;

a blower unit for supplying air for cooling the electronic device to the electronic device; and a control unit for controlling operations of the blower unit and the freezer, the control method including:

a blower power calculating step of calculating power consumption of a blower unit, based on a rotational speed of the blower unit;

a freezer power calculating step of calculating power consumption of the freezer, based on a calorific value of the electronic device, and a performance coefficient of the freezer;

an apparatus performance coefficient calculating step of calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

a blower unit rotation controlling step of controlling a rotational speed of the blower unit, based on the apparatus performance coefficient; and a coolant temperature controlling step of controlling a first coolant temperature being a temperature of the coolant flowing from the freezer, based on the apparatus performance coefficient.

[Supplementary Note 7]

A control method of a cooling apparatus including:

an evaporator for receiving exhaust heat of an electronic device;

a condenser for releasing the exhaust heat received by the evaporator;

a heat exchanger for receiving exhaust heat of the electronic device;

a freezer for releasing exhaust heat received by the heat exchanger and the evaporator by circulating coolant between the condenser and the heat exchanger;

a blower unit for supplying air for cooling the electronic device to the electronic device; and a control unit for controlling operations of the blower unit and the freezer, the control method including:

calculating power consumption of a blower unit, based on a rotational speed of the blower unit;

calculating power consumption of the freezer, based on a calorific value of the electronic device, and a performance coefficient of the freezer;

calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

controlling a rotational speed of the blower unit, based on the apparatus performance coefficient; and controlling a first coolant temperature being a temperature of the coolant flowing from the freezer, based on the apparatus performance coefficient.

[Supplementary Note 8]

A control program of a cooling apparatus including:

an evaporator for receiving exhaust heat of an electronic device;

a condenser for releasing the exhaust heat received by the evaporator;

a heat exchanger for receiving exhaust heat of the electronic device;

a freezer for releasing exhaust heat received by the heat exchanger and the evaporator by circulating coolant between the condenser and the heat exchanger;

a blower unit for supplying air for cooling the electronic device to the electronic device; and a control unit for controlling operations of the blower unit and the freezer, the control program causing a computer to execute processing including:

a blower power calculating step of calculating power consumption of a blower unit, based on a rotational speed of the blower unit;

a freezer power calculating step of calculating power consumption of the freezer, based on a calorific value of the electronic device, and a performance coefficient of the freezer;

an apparatus performance coefficient calculating step of calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

a blower unit rotation controlling step of controlling a rotational speed of the blower unit, based on the apparatus performance coefficient; and a coolant temperature controlling step of controlling a first coolant temperature being a temperature of the coolant flowing from the freezer, based on the apparatus performance coefficient.

[Supplementary Note 9]

A control program of a cooling apparatus including:

an evaporator for receiving exhaust heat of an electronic device;

a condenser for releasing the exhaust heat received by the evaporator;

a heat exchanger for receiving exhaust heat of the electronic device;

a freezer for releasing exhaust heat received by the heat exchanger and the evaporator by circulating coolant between the condenser and the heat exchanger;

a blower unit for supplying air for cooling the electronic device to the electronic device; and a control unit for controlling operations of the blower unit and the freezer, the control program causing a computer to execute processing including:

calculating power consumption of a blower unit, based on a rotational speed of the blower unit;

calculating power consumption of the freezer, based on a calorific value of the electronic device, and a performance coefficient of the freezer;

calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

controlling a rotational speed of the blower unit, based on the apparatus performance coefficient; and controlling a first coolant temperature being a temperature of the coolant flowing from the freezer, based on the apparatus performance coefficient.

[Supplementary Note 10]

A storage medium storing a control program of a cooling apparatus including:

an evaporator for receiving exhaust heat of an electronic device;

a condenser for releasing the exhaust heat received by the evaporator;

a heat exchanger for receiving exhaust heat of the electronic device;

a freezer for releasing exhaust heat received by the heat exchanger and the evaporator by circulating coolant between the condenser and the heat exchanger;

a blower unit for supplying air for cooling the electronic device to the electronic device; and a control unit for controlling operations of the blower unit and the freezer, the storage medium storing a control program that causes a computer to execute processing including:

a blower power calculating step of calculating power consumption of a blower unit, based on a rotational speed of the blower unit;

a freezer power calculating step of calculating power consumption of the freezer, based on a calorific value of the electronic device, and a performance coefficient of the freezer;

an apparatus performance coefficient calculating step of calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

a blower unit rotation controlling step of controlling a rotational speed of the blower unit, based on the apparatus performance coefficient; and a coolant temperature controlling step of controlling a first coolant temperature being a temperature of the coolant flowing from the freezer, based on the apparatus performance coefficient.

[Supplementary Note 11]

A storage medium storing a control program of a cooling apparatus including:

an evaporator for receiving exhaust heat of an electronic device;

a condenser for releasing the exhaust heat received by the evaporator;

a heat exchanger for receiving exhaust heat of the electronic device;

a freezer for releasing exhaust heat received by the heat exchanger and the evaporator by circulating coolant between the condenser and the heat exchanger;

a blower unit for supplying air for cooling the electronic device to the electronic device; and a control unit for controlling operations of the blower unit and the freezer, the storage medium storing a control program that causes a computer to execute processing of:

calculating power consumption of a blower unit, based on a rotational speed of the blower unit;

calculating power consumption of the freezer, based on a calorific value of the electronic device, and a performance coefficient of the freezer;

calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

controlling a rotational speed of the blower unit, based on the apparatus performance coefficient; and controlling a first coolant temperature being a temperature of the coolant flowing from the freezer, based on the apparatus performance coefficient.

In the foregoing, the invention of the present application is described with reference to example embodiments (and examples). The invention of the present application, however, is not limited to the above-described example embodiments (and examples). A configuration and details of the invention of the present application may be modified in various ways comprehensible to a person skilled in the art within the scope of the invention of the present application.

REFERENCE SIGNS LIST

100 Server room
110 Rack
200 Machine room
201 First accommodation unit
202 Second accommodation unit
203 First opening portion
204 Second opening portion
300 Electronic device
400 Local cooler
410 Evaporator
411 Upper tank portion
412 Lower tank portion
413 Connecting pipe portion
414 Evaporator fin portion
420 Condenser
420A First condenser
420B Second condenser
421 Upper tank portion
422 Lower tank portion
423 Connecting pipe portion
424 Condenser fin portion
430 Steam pipe
440 Liquid pipe
450 First pipe
460 Second pipe
500 Air conditioner
510 Air conditioning blower unit
520 Heat exchanger
530 Freezer
530A First freezer
530B Second freezer
540 Third pipe 550 Fourth pipe
560, 560A, 560B Control unit
570, 570A Judging unit
571, 571A Temperature acquisition unit
572, 572A Central control unit
572a Freezer power calculation unit
572b Apparatus performance coefficient calculation unit
572c Blower power calculation unit
572d Local cooler heat exchanging amount calculation unit
573 Data table
580 Output unit
581 Blower rotational speed control unit
582 Coolant temperature control unit
610 First temperature detection unit
620 Second temperature detection unit
630 Third temperature detection unit
700 Flow rate detection unit
900 Housing
1000, 1000A, 1000B Cooling apparatus

The invention claimed is:

1. A cooling apparatus comprising:
an evaporator receiving exhaust heat of an electronic device;
a condenser releasing the exhaust heat received by the evaporator;
a heat exchanger receiving exhaust heat of the electronic device;
a freezer releasing exhaust heat received by the heat exchanger and the evaporator, by circulating coolant between the condenser and the heat exchanger;
a blower unit supplying a blast for cooling the electronic device to the electronic device; and
control unit controlling operations of the blower unit and the freezer, wherein
the control unit includes:
blower power calculation unit calculating power consumption of a blower unit, based on a rotational speed of the blower unit;
freezer power calculation unit calculating power consumption of the freezer, based on a calorific value of the electronic device, and a performance coefficient of the freezer;
apparatus performance coefficient calculation unit calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;
blower unit rotation control unit controlling a rotational speed of the blower unit, based on the apparatus performance coefficient; and
coolant temperature control unit controlling a first coolant temperature being a temperature of the coolant flowing from the freezer, based on the apparatus performance coefficient.

2. The cooling apparatus according to claim 1, further comprising
local cooler heat exchanging amount calculation unit calculating a heat exchanging amount of the local cooler, based on the first coolant temperature, a second coolant temperature being a temperature of the coolant flowing through a first pipe that carries the coolant from the condenser to the freezer, and a coolant flow rate being a flow rate of coolant flowing through the first pipe, wherein
the freezer power calculation unit calculates power consumption of the freezer, based on a heat exchanging amount of the local cooler, a heat exchanging amount of the air conditioner, and a performance coefficient of the freezer.

3. The cooling apparatus according to claim 1, wherein
the blower unit rotation control unit controls a rotational speed of the blower unit in such a way that the apparatus performance coefficient becomes maximum, while satisfying that a supply temperature being a temperature of air supplied from the blower unit to the electronic device is equal to or lower than an upper limit threshold value of the supply temperature, and
the coolant temperature control unit controls the first coolant temperature in such a way that the apparatus performance coefficient becomes maximum, while satisfying that the supply temperature is equal to or lower than an upper limit threshold value of the supply temperature.

4. The cooling apparatus according to claim 1, wherein
the blower unit rotation control unit controls a rotational speed of the blower unit, after a predetermined time elapses after the apparatus performance coefficient becomes maximum, while satisfying that a supply temperature being a temperature of air supplied from the blower unit to the electronic device is equal to or lower than an upper limit threshold value of the supply temperature.

5. The cooling apparatus according to claim 4, wherein
the predetermined time is a time until a temperature in a vicinity of the freezer changes to a value that is determined in advance.

6. A control method of a cooling apparatus including:
an evaporator receiving exhaust heat of an electronic device;
a condenser releasing the exhaust heat received by the evaporator;
a heat exchanger receiving exhaust heat of the electronic device;
a freezer releasing exhaust heat received by the heat exchanger and the evaporator, by circulating coolant between the condenser and the heat exchanger;
a blower unit supplying a blast for cooling the electronic device to the electronic device; and
control unit controlling operations of the blower unit and the freezer, the control method comprising:
calculating power consumption of a blower unit, based on a rotational speed of the blower unit;
calculating power consumption of the freezer, based on a calorific value of the electronic device, and a performance coefficient of the freezer;
calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;
controlling a rotational speed of the blower unit, based on the apparatus performance coefficient; and
controlling a first coolant temperature being a temperature of the coolant flowing from the freezer, based on the apparatus performance coefficient.

7. A storage medium storing a control program of a cooling apparatus including:
an evaporator receiving exhaust heat of an electronic device;

a condenser releasing the exhaust heat received by the evaporator;

a heat exchanger receiving exhaust heat of the electronic device;

a freezer releasing exhaust heat received by the heat exchanger and the evaporator, by circulating coolant between the condenser and the heat exchanger;

a blower unit supplying a blast for cooling the electronic device to the electronic device; and control unit controlling operations of the blower unit and the freezer, the storage medium storing a control program that causes a computer to execute processing of:

calculating power consumption of a blower unit, based on a rotational speed of the blower unit;

calculating power consumption of the freezer, based on a calorific value of the electronic device, and a performance coefficient of the freezer;

calculating an apparatus performance coefficient being a performance coefficient of an apparatus including the evaporator, the condenser, the heat exchanger, the freezer, and the blower unit, based on a calorific value of the electronic device, power consumption of the freezer, and power consumption of the blower unit;

controlling a rotational speed of the blower unit, based on the apparatus performance coefficient; and controlling a first coolant temperature being a temperature of the coolant flowing from the freezer, based on the apparatus performance coefficient.

* * * * *